US 9,342,649 B2

(12) United States Patent
Morishita et al.

(10) Patent No.: US 9,342,649 B2
(45) Date of Patent: May 17, 2016

(54) RULE CHECK SYSTEM, METHOD, AND NON-TRANSITORY COMPUTER READABLE MEDIUM STORING PRESENTATION PROGRAM

(71) Applicant: NEC Corporation, Tokyo (JP)

(72) Inventors: Ken Morishita, Tokyo (JP); Hisashi Ishida, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/387,259

(22) PCT Filed: Oct. 18, 2012

(86) PCT No.: PCT/JP2012/006681
§ 371 (c)(1),
(2) Date: Sep. 23, 2014

(87) PCT Pub. No.: WO2013/140471
PCT Pub. Date: Sep. 26, 2013

(65) Prior Publication Data
US 2015/0286770 A1    Oct. 8, 2015

(30) Foreign Application Priority Data

Mar. 23, 2012    (JP) .................................. 2012-067381

(51) Int. Cl.
*G06F 9/455*    (2006.01)
*G06F 17/50*    (2006.01)
(Continued)

(52) U.S. Cl.
CPC .......... *G06F 17/5081* (2013.01); *H05K 1/0225* (2013.01); *H05K 3/0005* (2013.01)

(58) Field of Classification Search
USPC .................................. 716/111, 112, 113, 115
See application file for complete search history.

(56) References Cited

U.S. PATENT DOCUMENTS 7,949,977 B2 * 5/2011 Kouzaki .............. G06F 17/5036
716/106
7,957,150 B2 * 6/2011 Osaka .................. H05K 3/0005
174/260

(Continued)

FOREIGN PATENT DOCUMENTS

JP    03-118665    5/1991
JP    2006-126745    5/2006

(Continued)

OTHER PUBLICATIONS

International Search Report, PC/JP2012/006681, Jan. 22, 2013.

*Primary Examiner* — Brian Ngo
(74) *Attorney, Agent, or Firm* — Young & Thompson

(57) ABSTRACT

To specify high-risk error positions in consideration of effects of electromagnetic noise flowing through a printed wiring board. A design rule check system (1) includes a pattern information acquisition unit (11) for acquiring a layout pattern of a board to be checked, a design rule check unit (12) for carrying out a design rule check on the layout pattern, a current calculation unit (13) for calculating distribution of noise current values on the board based on the layout pattern, a weighting unit (14) for adding a weight to a result of the design rule check according to the magnitude of the noise current values calculated by the current calculation unit (13) and corresponding to each error position detected through the design rule check, and an error information generation unit (15) which generates information indicating a risk level of each error position based on the weight.

7 Claims, 24 Drawing Sheets

(51) Int. Cl.
*H05K 1/02* (2006.01)
*H05K 3/00* (2006.01)

(56) References Cited

U.S. PATENT DOCUMENTS

| | | |
|---|---|---|
| 8,516,431 B2 | 8/2013 | Yaguchi |
| 2006/0117289 A1* | 6/2006 | Katagiri .............. G06F 17/5077 716/115 |
| 2006/0123380 A1* | 6/2006 | Ikeuchi .............. G06F 17/5081 716/52 |
| 2006/0242615 A1 | 10/2006 | Mimura et al. |
| 2010/0275172 A1* | 10/2010 | Yaguchi .............. G06F 17/5031 716/123 |
| 2011/0320995 A1* | 12/2011 | Osaka ................ G06F 17/5036 716/115 |
| 2013/0047130 A1* | 2/2013 | Daellenbach ....... G06F 17/5077 716/113 |

FOREIGN PATENT DOCUMENTS

| | | |
|---|---|---|
| JP | 2009-211405 | 9/2009 |
| JP | 2010-257098 | 11/2010 |
| JP | 2011-210085 | 10/2011 |
| WO | WO 2005/076163 | 8/2005 |

\* cited by examiner

Fig. 13
FIRST DISTRIBUTION
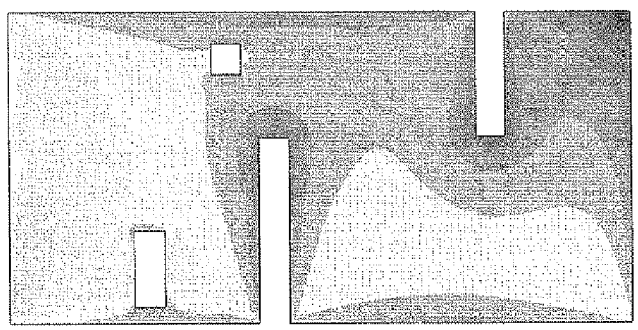
CURRENT LARGE
CURRENT SMALL
SECOND DISTRIBUTION
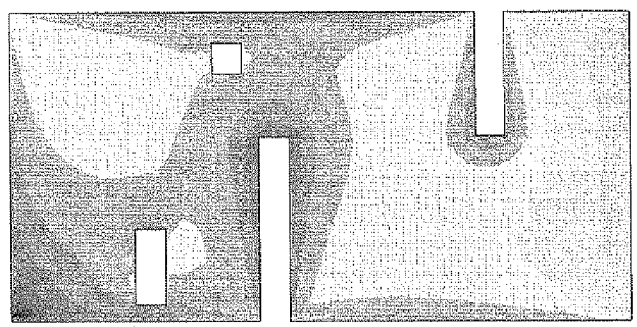
THIRD DISTRIBUTION
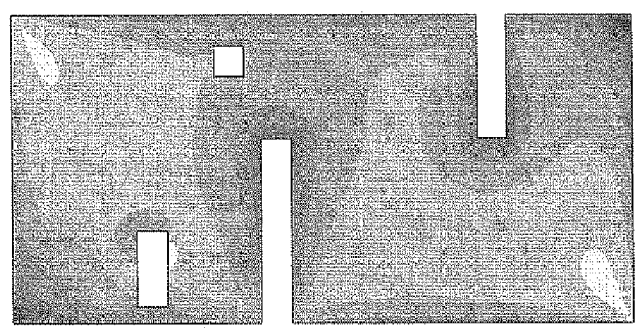

Fig. 23
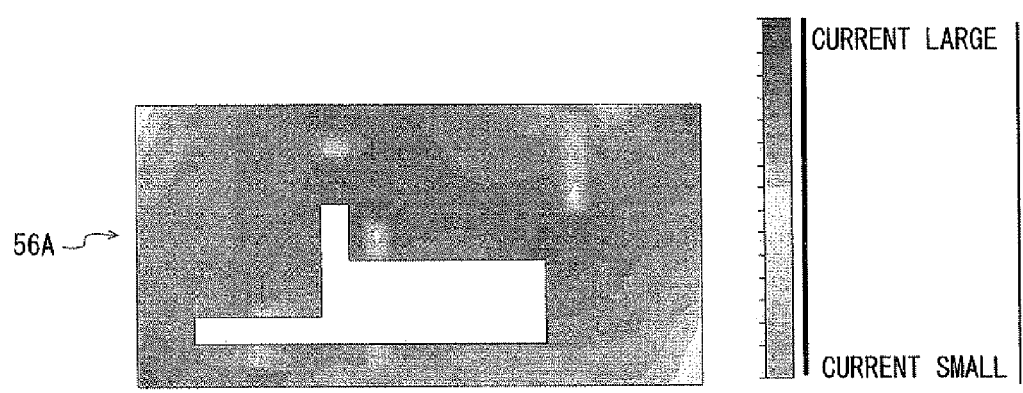
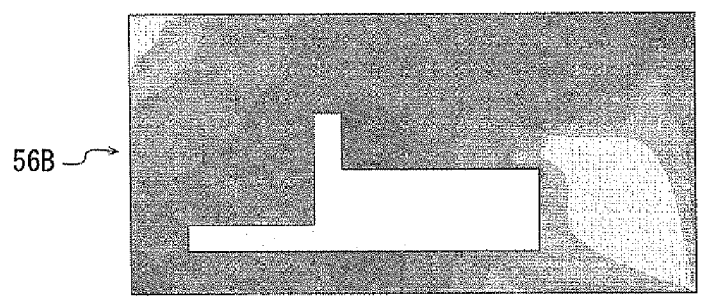

Fig. 25
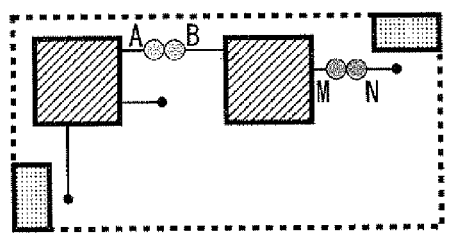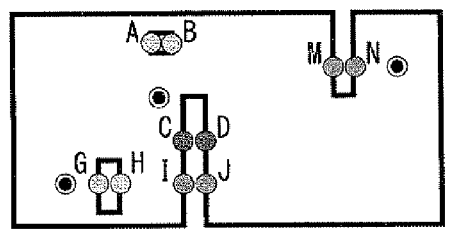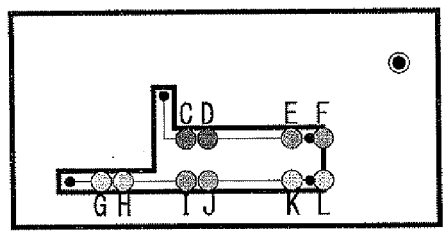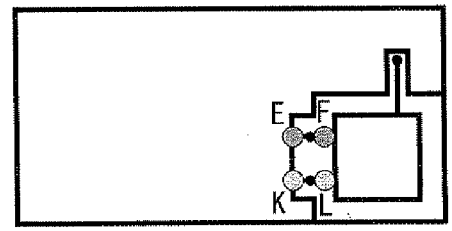
| ERROR RISK LEVEL (CURRENT VALUE) | ERROR WIRE NUMBER:ERROR POSITIONS |
|---|---|
| HIGH | 2:C,D |
| INTERMEDIATE | 2:E,F   3:I,J   4:M,N |
| LOW | 1:A,B   3:G,H   3:K,L |

| ERROR RISK LEVEL (CURRENT VALUE) | ERROR WIRE NUMBER:ERROR POSITIONS |
|---|---|
| INTERMEDIATE | 2:C,D  4:I,J |
| LOW | 1:A,B  3:E,F  3:G,H |

RULE CHECK SYSTEM, METHOD, AND NON-TRANSITORY COMPUTER READABLE MEDIUM STORING PRESENTATION PROGRAM

TECHNICAL FIELD

The present invention relates to a design rule check system and the like of a printed wiring board.

BACKGROUND ART

In a system disclosed in patent literature 1, wiring pattern information, wiring restriction information, and board information are input, and a check result list and a non-connected section list are output. That is, the system reads design data of a printed wiring board, and then detects, for each design rule check item that has been designated as a design rule in advance, parts and contents which do not satisfy a designated threshold value, and indicates these parts and contents as an error message.

Patent literature 2 discloses a technique for regarding design rule check items for improving electromagnetic characteristics as "items that do not necessarily need error correction", and extracting important errors among these items. According to this system, a design rule check is performed based on wiring information indicating the wiring pattern of each net and design rules indicating constraints of the wiring patterns, and based on the results, screening processing is performed to display the presence or absence of errors for each operating frequency of each net. In short, errors are classified into levels by the operating frequency of the net.

Patent literature 3 discloses level classification of these errors. Patent literature 3 discloses a technique of classifying the risk for the electromagnetic characteristics into levels for each wire in a system for checking positions where a wire crosses a slit or the like of a plane conductor. According to this system, a wire and a plurality of plane conductor layers of a check target are extracted from a CAD data, their projection overlapping are detected, and an attribute of each plane conductor layer is also judged. The wire which crosses between the similar plane conductor layers and the wire which crosses between the different plane layers are classified, different coefficients are added, and each efficient is multiplied by the number of times that the slit and the like are crossed, to digitize the risk level for each wire. As a result, the degrees of influence by the wire crossing between the plane conductor layers are classified by the levels depending on the kind of plane conductor layers and the number of times of crossing.

CITATION LIST

Patent Literature

Patent literature 1: Japanese Unexamined Patent Application Publication No. 03-118665
Patent literature 2: Japanese Unexamined Patent Application Publication No. 2010-257098
Patent literature 3: Japanese Unexamined Patent Application Publication No. 2009-211405

SUMMARY OF INVENTION

Technical Problem

In an LSI (Large Scale Integration) and a printed wiring board with ICs (Integrated Circuits) mounted thereon, it is necessary to improve electromagnetic noise characteristics. That is, it is necessary to suppress emission of unnecessary electromagnetic noise to outside, and to prevent destruction and malfunction due to the electromagnetic noise mixed from the outside.

If design change to improve an electromagnetic noise characteristic and an addition of a measure component are performed after production of a printed wiring board, it leads to prolongation in a development period and an increase in the production cost. For this reason, it is desirable to check electromagnetic noise characteristics when a printed wiring board is designed, and to take measures to improve the electromagnetic noise characteristics as required.

Consider here destruction, malfunction and the like of a device due to the electromagnetic noise mixed from the outside regarding electromagnetic characteristics of a printed wiring board. The electromagnetic noise outside of the printed wiring board includes spatial noise emitted from other devices, noise due to lightning discharge, noise of a power supply, noise generated due to a contact with other charged devices, charged persons or the like. Such an external noise enters the printed wiring board from an antenna for radio communication, a power supply, communication cables, connectors for connecting peripheral devices, a gap between a case and a connector, various buttons and switches for operating the device, for example.

The electromagnetic noise which enters from these components and a gap of its periphery flows into a conductor pattern with lowest inductance from the entrance, and propagates inside the printed wiring board as a noise current. In the printed wiring board, in general, the inductance of a plane conductor formed in substantially the whole area of one layer of a multi-layer structure and having a large area is the lowest, and this plane conductor is likely to become a propagation path of the noise current.

When the noise current propagates on the plane conductor, an electromagnetic field is generated around the plane conductor. This electromagnetic field magnetically couples the propagation path and another conductor on the path, which causes a voltage between both conductors. For example, due to the noise current which propagates through a ground plane, a voltage is induced between a wire and a ground plane or between a power supply and a ground plane. When an extremely large voltage is induced at this time, it leads to destruction, malfunction or the like of the LSI, the IC or the like.

A position where the electromagnetic field by the noise current is likely to be coupled on the printed wiring board is a part which forms a structural and electrical discontinuity of a signal transmission system, e.g., a position where a wire crosses a slit or the like. Meanwhile, in a position where a large volume of noise current flows on a plane conductor, the electromagnetic field generated around the position is strong. If another conductor is arranged near this position, a large voltage is induced between two conductors. Therefore, there is a high possibility that a large induced voltage is generated as a large volume of noise current flows through the position where the electromagnetic field is likely to be coupled. In order to classifying the errors into levels to narrow down the position that should be remedied preferentially when a large number of errors are detected in the design rule check regarding electromagnetic characteristics, it is therefore important to know the magnitude of the noise current of the error occurrence position.

The system disclosed in Patent literature 2 performs error level classification by an operating frequency of a net for electromagnetic noise emitted to outside from each net. However, the failure due to the electromagnetic noise mixed from the outside is greatly influenced by a voltage induced among a wire, a power supply, and a ground conductor, and not influenced by the operating frequency of the net itself. Furthermore, it is impossible in this system to know the noise current in the error occurrence position. Therefore, with the design rule check system disclosed in patent literature 2, it is impossible to perform level classification of error positions based on the noise current propagating through the printed wiring board for the electromagnetic noise mixed from the outside.

The system disclosed in Patent literature 3 performs level classification by attributes of a plane layer crossed by a wire to be checked and the number of times that the plane is crossed. As is similar to Patent literature 2, however, with the system disclosed in Patent literature 3, it is impossible to perform level classification of error positions based on a noise current.

The present invention aims to specify high-risk error positions in consideration of the effects of electromagnetic noise flowing through a printed wiring board.

Solution to Problem

A first exemplary aspect of the present invention is a design rule check system including: a pattern information acquisition unit for acquiring a layout pattern of a board to be checked; a design rule check unit for carrying out a design rule check on the layout pattern; a current calculation unit for calculating, based on the layout pattern, distribution of noise current values on the board; a weighting unit for adding a weight to a result of the design rule check according to the magnitude of the noise current values calculated by the current calculation unit and corresponding to each error position detected through the design rule check; and an error information generation unit for generating information indicating a risk level of each error position based on the weight.

A second exemplary aspect of the present invention is a design rule check method including: a pattern information acquisition step for acquiring a layout pattern of a board to be checked; a design rule check step for carrying out a design rule check on the layout pattern; a current calculation step for calculating, based on the layout pattern, distribution of noise current values on the board; a weighting step for adding a weight to a result of the design rule check according to the magnitude of the noise current values calculated by the current calculation step and corresponding to each error position detected through the design rule check; and an error information generation step for generating information indicating a risk level of each error position based on the weight.

A third exemplary aspect of the present invention is a non-transitory computer readable medium storing a design rule check program for causing a computer to execute the following processing of: pattern information acquisition processing for acquiring a layout pattern of a board to be checked; design rule check processing for carrying out a design rule check on the layout pattern; current calculation processing for calculating, based on the layout pattern, distribution of noise current values on the board; weighting processing for adding a weight to a result of the design rule check according to the magnitude of the noise current values calculated by the current calculation processing and corresponding to each error position detected through the design rule check; and error information generation processing for generating information indicating a risk level of each error position based on the weight.

Advantageous Effects of Invention

According to the present invention, it is possible to specify high-risk error positions in consideration of the effects of electromagnetic noise flowing through a printed wiring board.

BRIEF DESCRIPTION OF DRAWINGS

FIG. 13 illustrates distributions of noise currents of the plane conductors shown in FIGS. 8 to 11 calculated by the electromagnetic simulation;

FIG. 23 is a diagram illustrating current distribution of a front surface and current distribution of a rear surface of a plane conductor in a third layer in the example shown in FIG. 19;

FIG. 25 illustrates error information display when weighting is required in the examples shown in FIGS. 19 to 24;

DESCRIPTION OF EMBODIMENTS

First Exemplary Embodiment

Figure 1:
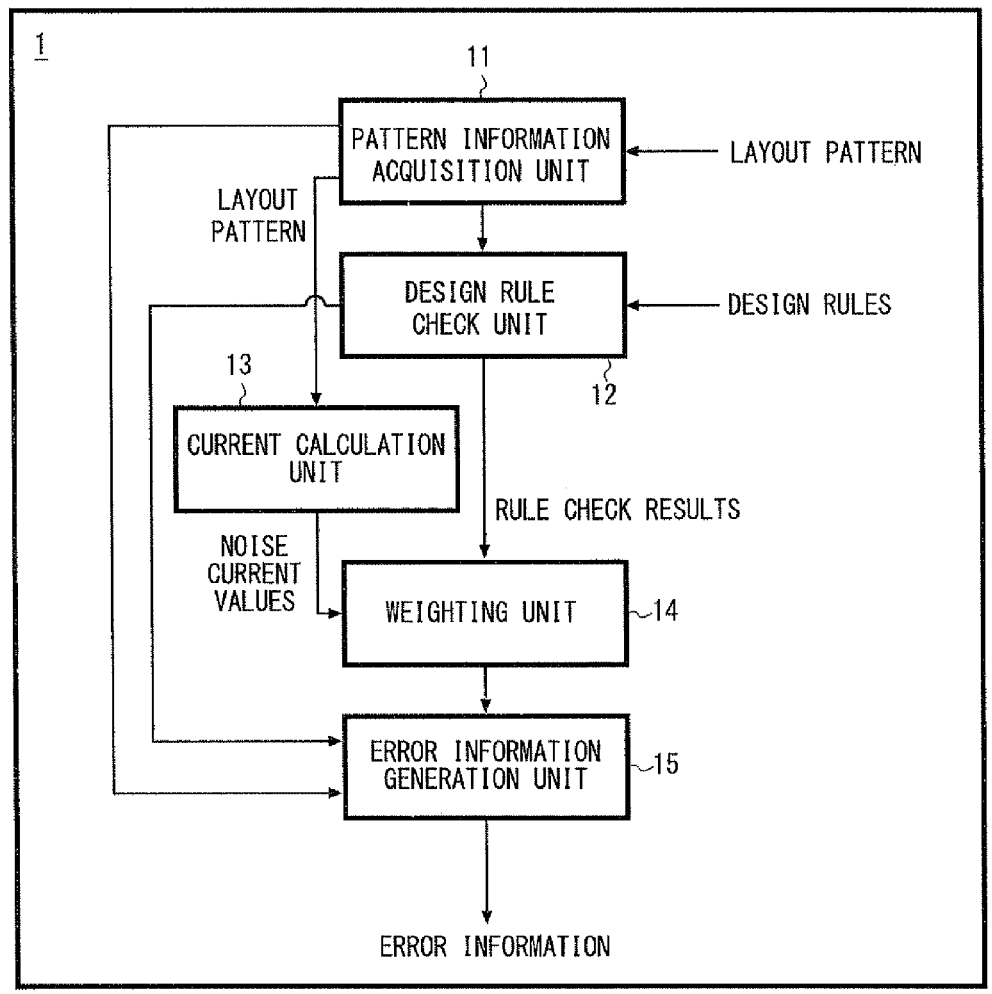
FIG. 1 is a diagram showing a functional configuration of a design rule check system according to a first exemplary embodiment of the present invention.

Hereinafter, with reference to the drawings, exemplary embodiments of the present invention will be described. FIG. 1 shows a functional configuration of a design rule check system 1 according to a first exemplary embodiment of the present invention. The design rule check system 1 includes a pattern information acquisition unit 11, a design rule check unit 12, a current calculation unit 13, a weighting unit 14, and an error information generation unit 15.

The pattern information acquisition unit 11 acquires a layout pattern of a printed wiring board which is a target of a design rule check.

The design rule check unit 12 carries out the design rule check on the layout pattern that is acquired.

The current calculation unit 13 calculates distribution of noise current values on the printed wiring board based on the layout pattern that is acquired. In short, the effects of electromagnetic noise given from the outside to the printed wiring board are searched. The effects of electromagnetic noise (distribution of noise current values) depend on the layout pattern, and differ depending on the position on the printed wiring board.

The weighting unit 14 weights the results of the design rule check according to the magnitude of the noise current value calculated by the current calculation unit 13 and corresponding to each error position found by the design rule check.

The error information generation unit 15 generates information indicating the results of the design rule check. When the weighting is carried out, information indicating the weighted results of the design rule check is generated. When weighting is not carried out, information indicating the direct results of the operation performed in the design rule check unit 12 is generated. The information regarding errors thus generated is provided to a user or the like of the design rule check system 1.

According to the configuration stated above, the results of the design rule check are weighted according to the noise current value flowing through the printed wiring board. The risk level of each error is then assumed according to the weighting, and error information including the risk level is generated. This allows the user to easily find the positions with high error risk, i.e., the positions where the design should be preferentially changed.

Figure 2:
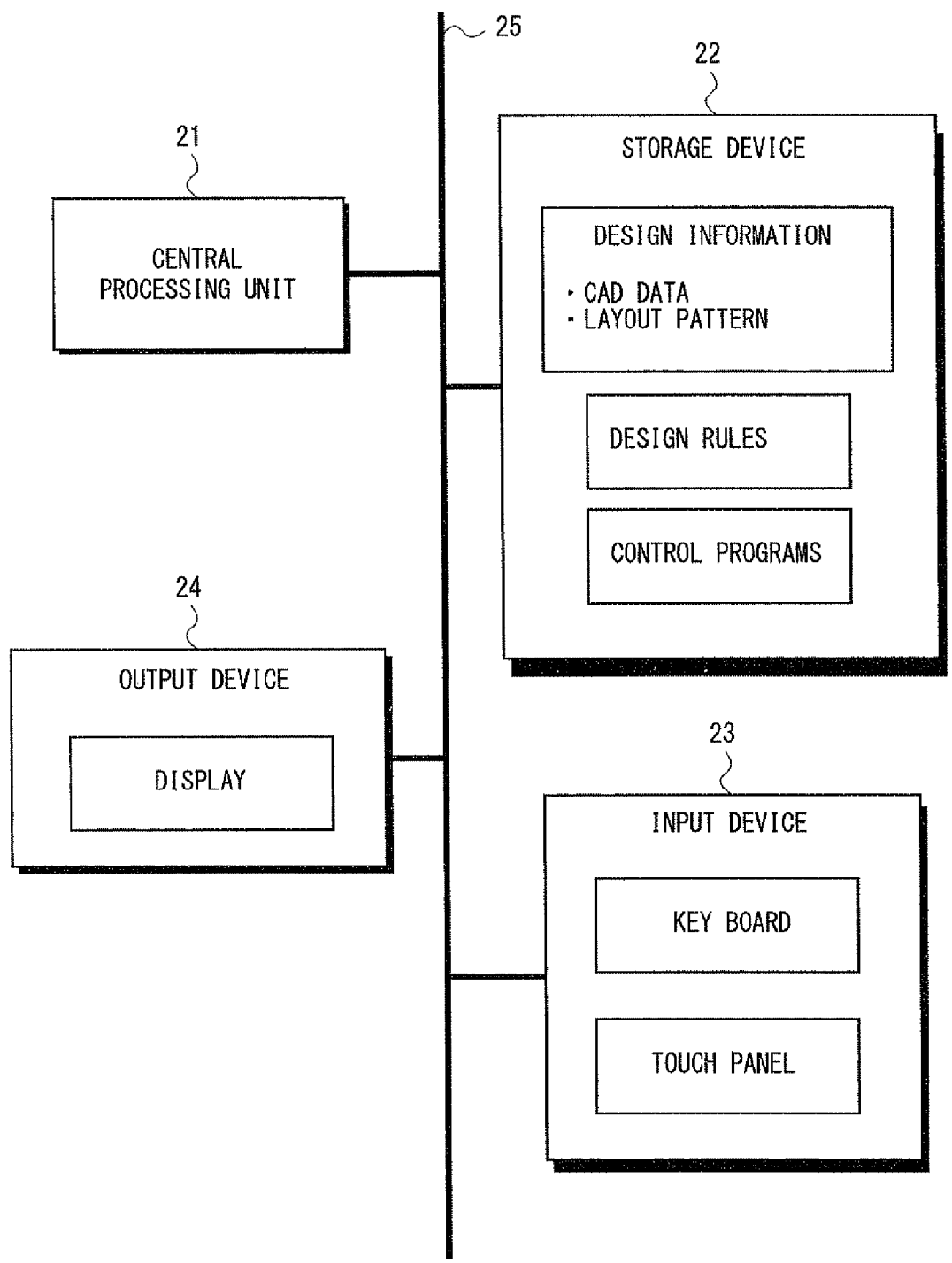
FIG. 2 is a diagram illustrating a hardware configuration of the design rule check system according to the first exemplary embodiment.

FIG. 2 illustrates a hardware configuration of the design rule check system 1 according to the first exemplary embodiment. The design rule check system 1 according to this example is formed using a computer, and this computer includes a central processing unit 21, a storage device 22, an input device 23, an output device 24, and a bus 25.

The central processing unit 21 executes various processing to implement each function shown in FIG. 1 stated above according to control programs stored in the storage device 22.

The storage device 22 stores design information (CAD data and the like) of the printed wiring board, design rules, control programs and the like. The design information includes the shape of the printed wiring board, the shape of the wires, the shapes and the positions of a power supply and a ground, positional relations of active elements and passive elements. The layout pattern is acquired from the design information.

The design rules include constraint conditions regarding arrangement of active elements and passive elements, and conductor patterns of the ground, the power supply, and the wires of the printed wiring board. Each check item of the design rules relates to electromagnetic characteristics of the printed wiring board.

The input device 23 includes a key board, a touch panel and the like, and receives various operations by the user. Preferably, the design information, the design rules and the like stored in the storage device 22 may be changed by the user as appropriate via the input device 23.

The output device 24 is a display and the like, and plays a role in transmitting information indicating the results of the design rule check to the user, for example.

Figure 3:
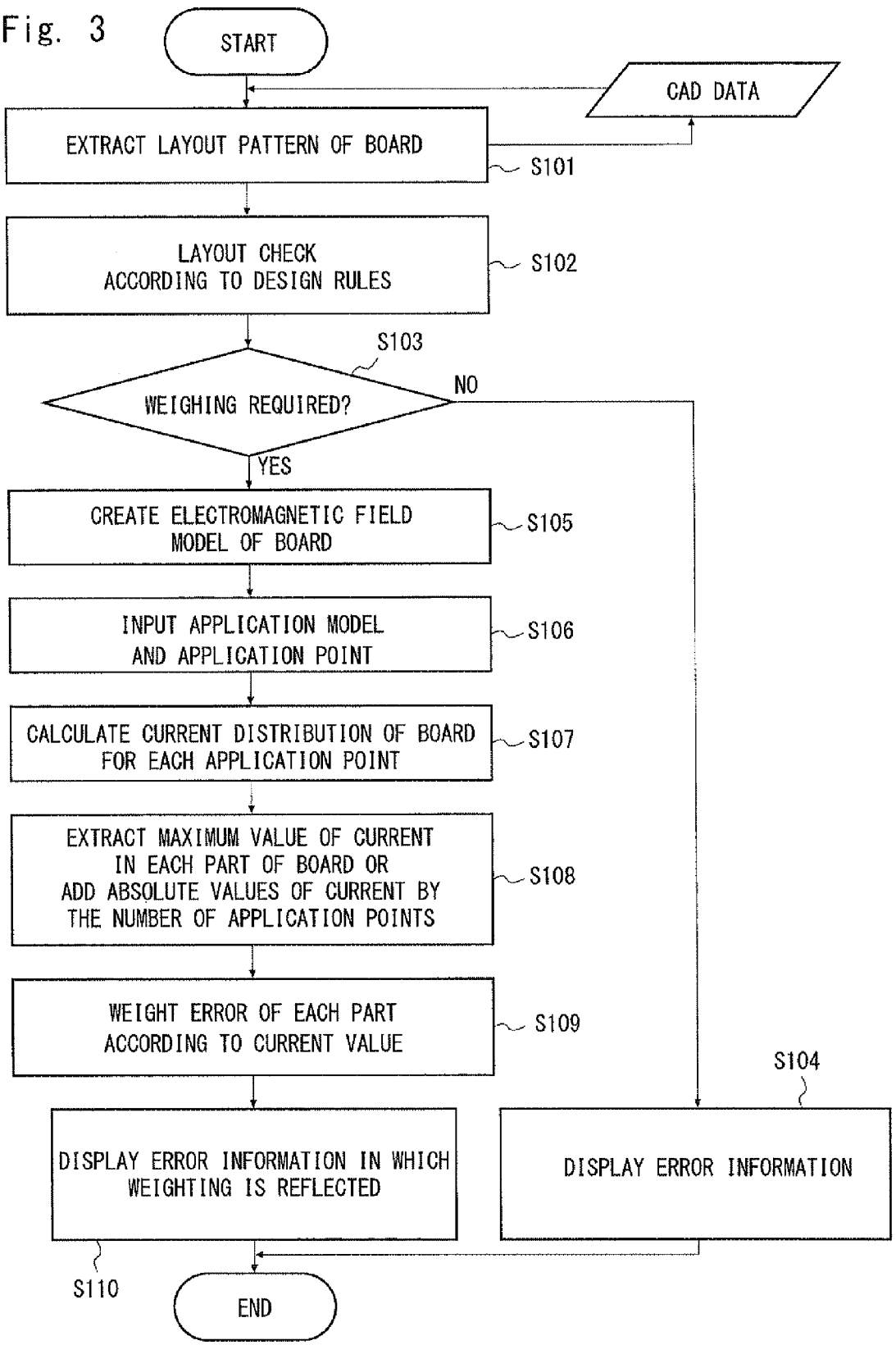
FIG. 3 is a flowchart illustrating an operation of the design rule check system according to the first exemplary embodiment.

FIG. 3 shows an operation of the design rule check system 1. When the system starts the operation, the pattern information acquisition unit 11 reads the CAD data of the printed wiring board to acquire the layout pattern including information of wiring layers, positional coordinates of the wires, the power supply, the ground, the active elements, and the passive elements and the like (S101).

The design rule check unit 12 next reads the design rules to carry out the design rule check on the layout pattern that is acquired to determine whether the layout pattern satisfies the constraints defined by the design rule check items (S102).

Next, it is determined whether the results of the design rule check need to be weighted in consideration of the electromagnetic noise from the outside, or in other words, whether the level classification of the error positions is required (S103). In this determination, such an operation may be performed in which the number of errors of the check results is presented to the user and the user inputs information indicating whether to perform weighting or not. Alternatively, another operation may be performed in which weighting processing is automatically carried out if the number of errors is equal to or larger than a predetermined number.

When there is no need to perform weighting in Step S103 (NO), the error information generation unit 15 causes the output device 24 to output error information display described later including an error marked layout pattern and an error list (S104). In the error marked layout pattern, error positions on the layout pattern are marked, and the error list indicates a corresponding relation of identification names and error items of the wires.

Meanwhile, when it is determined in Step S103 that weighting is required (YES), the current calculation unit 13 creates an electromagnetic field model of the board (plane conductor) based on the layout pattern (S105), inputs an application model and an application point described later to the electromagnetic field model (S106), to calculate the current distribution of the board for each application point (S107). After that, the current calculation unit 13 extracts the maximum value of the current in each part in each application point, or adds the current values in each part in each application point (S108), to calculate the noise current value in each part on the board required for the weighting.

The weighting unit 14 weights the results of the error detection by the design rule check according to the magnitude of the noise current values calculated in Step S108 and corresponding to the error position (S109).

The error information generation unit 15 then causes the output device 24 to output error information display described later including the error list and the error marked layout pattern in which the weighting is reflected (S110).

The current calculation unit 13 extracts, based on the layout pattern acquired by the pattern information acquisition unit 11, information regarding the positions of plane conductors forming the power supply and the ground plane, vias and capacitors which electrically connect the plane conductors, a connector, a switch and the like (noise application point) from which the electromagnetic noise enters, the shape and the material of a dielectric substrate. Based on these extracted information, distribution of noise current values on the plane conductor is calculated by the electromagnetic field simulation.

A three-dimensional electromagnetic field simulation method such as the FDTD (Finite Difference Time Domain) method, the moment method, the finite element method widely known to public may be used as the electromagnetic field simulation.

Consider here a failure or malfunction of devices due to a pulse noise with wide-bandwidth frequency spectrum as external noise. In this case, the maximum value in the time domain of the noise current is more important than the noise current value for each frequency. In such a case, a time-domain electromagnetic field simulation represented by the FDTD method is preferably used. Meanwhile, consider single frequency noise or narrow band noise. In this case, a frequency-domain electromagnetic field simulation such as the moment method or the finite element method is preferably used, thereby being able to efficiently calculate the noise current.

In the electromagnetic field simulation, the position from which the noise enters, i.e., the noise application point in the simulation, is a connector or a switch. Another configuration may be employed instead so that the noise can be applied to an arbitrary position specified by the user.

A noise source and a noise waveform used for the simulation may be obtained for example, using a method of modeling a discharge simulator in conformity with IEC61000-4-2 which is the testing standards regarding electrostatic discharge, or a method of forming a model which contacts a minute linear antenna to a plane conductor to apply a pulse voltage or a single-frequency sinusoidal voltage.

As the current calculation unit 13, models of a plurality of noise sources and noise waveforms may be prepared, and the external noise that is assumed may be selected by the user.

Consider a case where there are a plurality of connectors on the printed wiring board. In such a case, when the user specifies a plurality of noise application positions, for example, the noise current flowing through the plane conductor is calculated for each of the noise application points.

Next, one current distribution is formed by comparing the current values for each application point in each part on the plane conductor and extracting the current with maximum absolute value. Otherwise, one current distribution may be formed by adding the absolute values of the current for each application point in each part on the plane conductor. In this case, the current value becomes particularly larger in the position where the noise current tends to concentrate for the plurality of application points. In short, it is possible to highlight the high-risk areas regardless of the noise application point.

Next, the weighting unit weights the design rule check results by the noise current on the plane conductor corresponding to the error position (S109). In short, the noise current value on the plane conductor is added to each error data.

Figure 4:
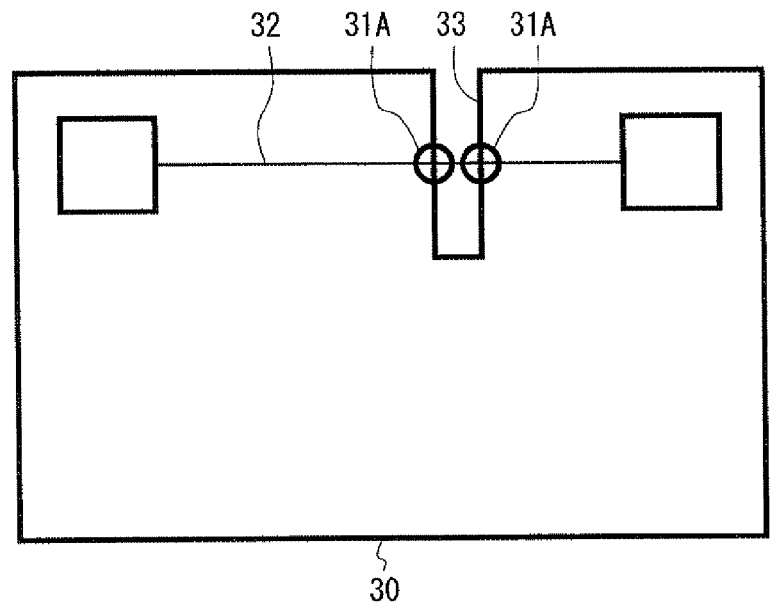
FIG. 4 is a diagram illustrating an error position found by a design rule check.

FIGS. 4 to 7 illustrate error positions. An error position 31A shown in FIG. 4 is a position where a wire 32 crosses slits 33 formed in a plane conductor 30.

Figure 5:
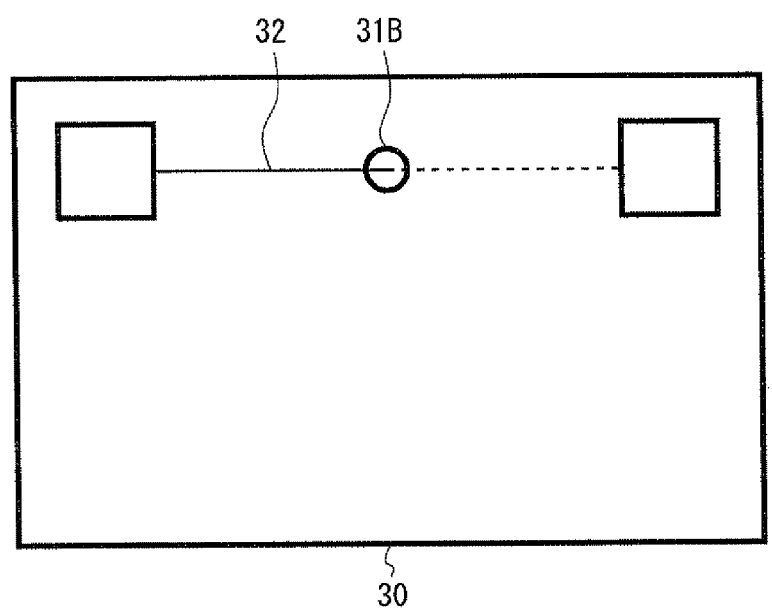
FIG. 5 is a diagram illustrating an error position found by the design rule check.

The error position 31B shown in FIG. 5 is the position of a via 35 which penetrates through a plurality of plane conductors 30. In such a case, the noise current value of the plane conductor 30 which is the closest to the via 35 is employed, for example, or the maximum value may be extracted from the noise currents of the plane conductors 30 located within a given distance from the via 35.

Figure 6:
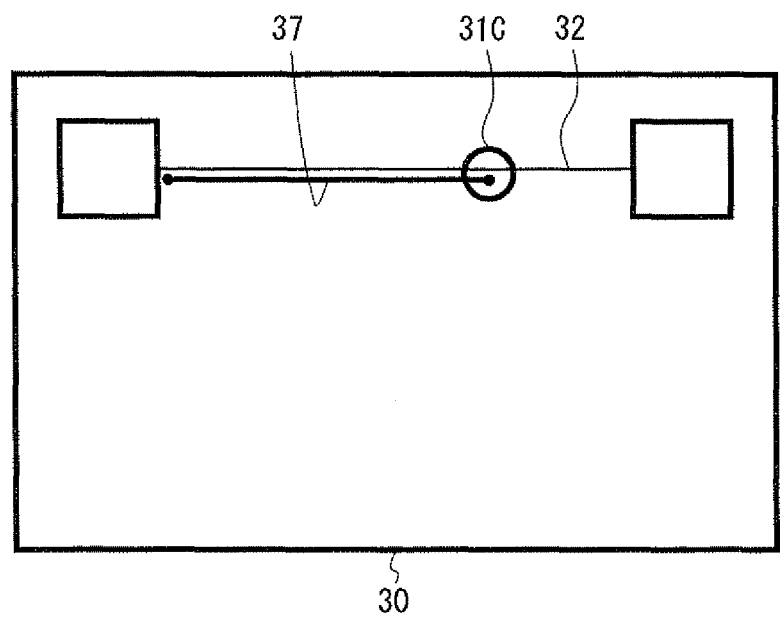
FIG. 6 is a diagram illustrating an error position found by the design rule check.

An error position 31C shown in FIG. 6 is a position where a guard pattern 37 is interrupted. In order to include the effects of the electromagnetic field occurred by the noise current around the error position, the maximum value of the noise currents within a given range may be extracted instead of extracting only one point on the plane conductor 30.

Figure 7:
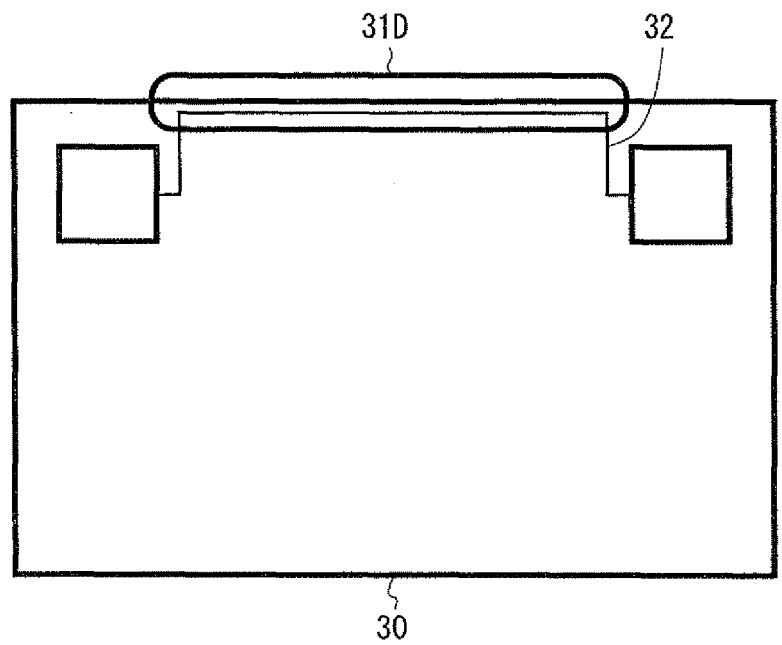
FIG. 7 is a diagram illustrating an error position found by the design rule check.

An error position 31D shown in FIG. 7 is a succession of error positions, and has the same length as that of the wire along the end part of the plane conductor 30. In this case, the maximum value of the noise currents may be extracted within the range where the error occurs. Otherwise, the error position having a range which exceeds a given length may be divided into a plurality of parts, and the maximum value of the noise currents may be extracted for each divided part.

The error check results that are weighted as described above are classified, for example, by the absolute value of the noise current, a relative value or the like based on the current of the noise application point, and are displayed as the error list, error marks on the layout pattern or the like described later. As will be described later, it is preferable that the error marks have different colors, shapes, sizes or the like depending on the weight, which makes it easy to distinguish the error risk level.

Figure 8:
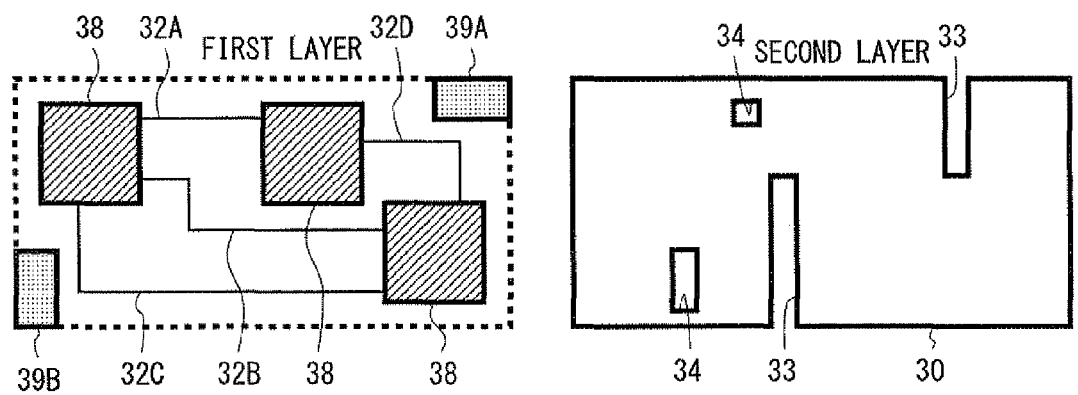
FIG. 8 is a diagram illustrating a layout pattern of a printed wiring board having a two-layer structure which is a target of the design rule check in the first exemplary embodiment.

FIG. 8 illustrates a layout pattern of a printed wiring board having a two-layer structure which is a target of the design rule check according to the first exemplary embodiment. The second layer indicates the plane conductor 30, and the first layer indicates the arrangement of wires 32A to 32D, LSIs 38, connectors 39A and 39B and the like mounted on the plane conductor 30. The first layer according to this example includes a first wire 32A, a second wire 32B, a third wire 32C, and a fourth wire 32D. Slits 33 and holes 34 are formed in the plane conductor 30 according to this example. The design information stored in the storage device 22 includes information to specify the shapes of the wires 32A to 32D forming the first layer, the dimensions of the LSIs 38 and the positions where the LSIs 38 are formed, the positions where the connectors 39A and 39B are formed, the dimension of the plane conductor 30, the dimensions of the slits 33 and holes 34 and the positions where the slits 33 and the holes 34 are formed. Further, this example includes a case in which the wires 32A to 32D cross the slits 33 or the holes 34 as design rule check items.

First, the pattern information acquisition unit 11 reads design information of the printed wiring board to acquire the layout pattern. Next, the design rule check unit 12 carries out the design rule check on the layout pattern information according to the design rules. Next, it is determined whether the results of the design rule check need to be weighted in consideration of the electromagnetic noise from the outside. When it is determined that weighting is not required, the results of the design rule check are directly displayed on a display or the like as the error information display.

Figure 9:
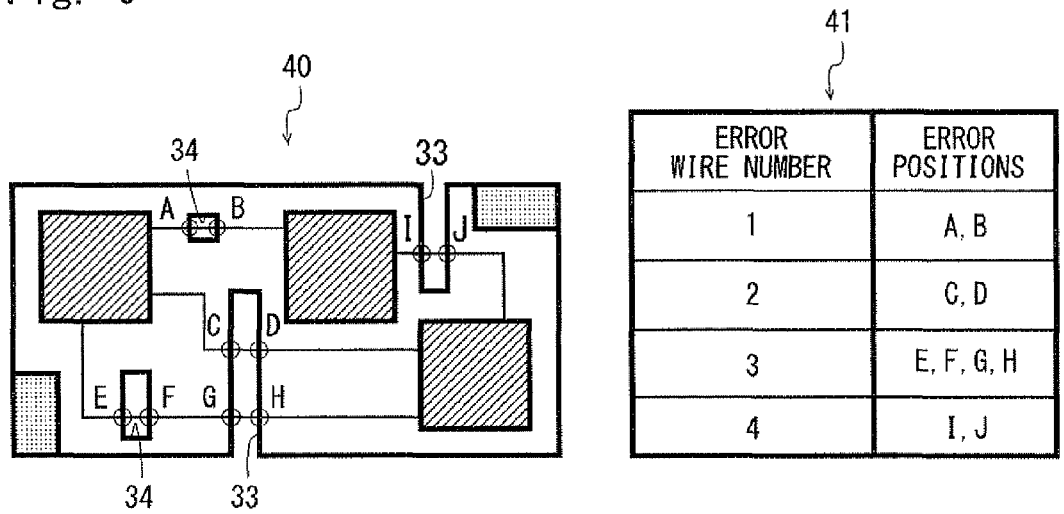
FIG. 9 is a diagram illustrating error information display when weighting is not required in the first exemplary embodiment.

FIG. 9 illustrates the error information display when weighting is not required. The error information display according to this example includes an error marked layout pattern 40 and an error list 41.

The error marked layout pattern 40 is formed by adding error marks (A to J and circles) to the layout pattern where the first layer and the second layer shown in FIG. 8 are overlapped. The error list 41 indicates error positions A to J for each of the wires 32A to 32D (error wire numbers 1 to 4).

Figure 10:
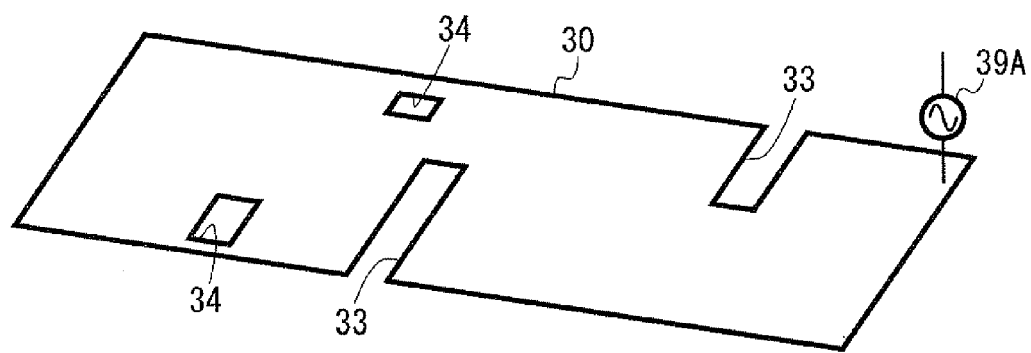
FIG. 10 is a diagram showing an electromagnetic field simulation model where positions of a plane conductor and a first connector are extracted from the layout pattern in the example of FIG. 8.
Figure 11:
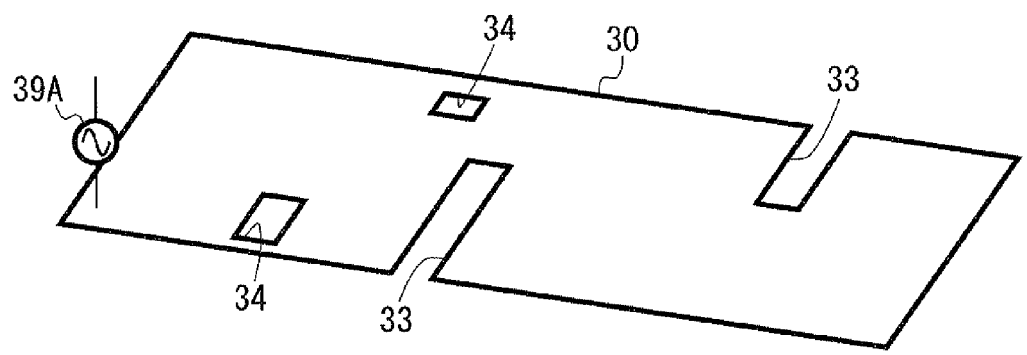
FIG. 11 is a diagram showing an electromagnetic field simulation model where positions of the plane conductor and a second connector are extracted from the layout pattern in the example of FIG. 8.

Meanwhile, when weighting is required, electromagnetic field simulation is started to calculate the noise current by the current calculation unit 13. FIG. 10 shows a state in which the locations of the plane conductor 30 and the first connector 39A are extracted from the layout data. FIG. 11 shows a state in which the locations of the plane conductor 30 and the second connector 39B are extracted from the layout data.

Figure 12:
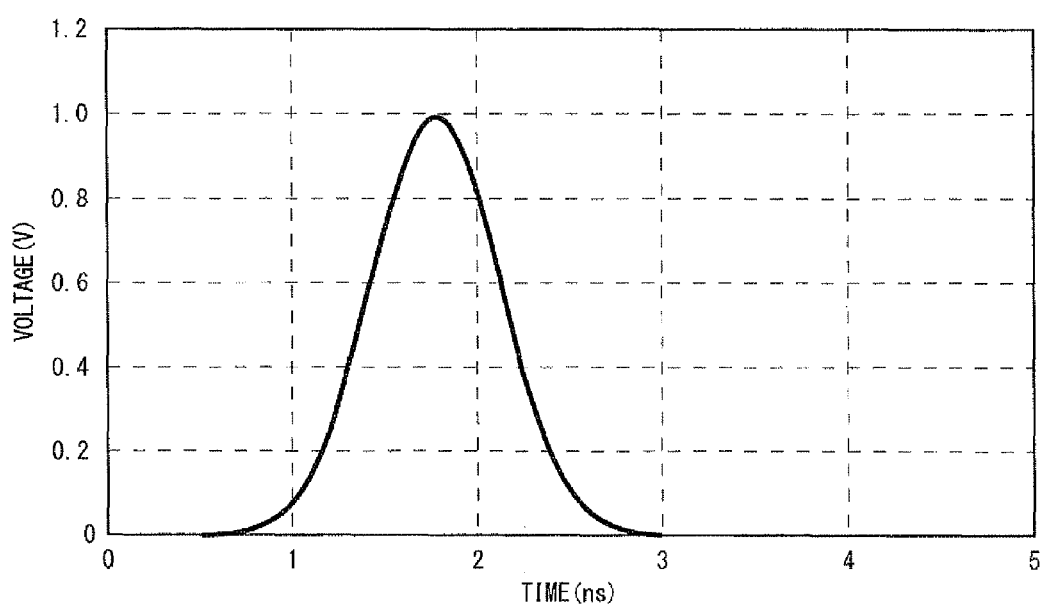
FIG. 12 is a graph illustrating a voltage pulse output from a voltage source used in the electromagnetic field simulation in the first exemplary embodiment.

The electromagnetic field simulation model is formed based on the extracted information, and the noise current on the plane conductor 30 is calculated for both models of FIG. 10 and FIG. 11. In this example, a model without the dielectric substrate is used. In this example, using the extracted central position of the connectors 39A and 39B as a noise application point, an application model is used in which one end of a linear antenna having a length of 1 mm is connected to the plane conductor 30. In this application model, a voltage source is provided at the center of a linear antenna, and a voltage pulse is applied from the voltage source as noise. FIG. 12 illustrates a voltage pulse output from the voltage source used in the electromagnetic field simulation. In this example, the FDTD method is employed to calculate the maximum value of the noise current in the time domain.

FIG. 13 illustrates distributions of noise currents of the plane conductor 30 shown in FIGS. 8 to 11 calculated by the electromagnetic simulation. In FIG. 13, color density indicates the magnitude of the current value. A darker region has a higher current value. A first distribution is current distribution by noise application from the first connector 39A. A second distribution is current distribution by noise application from the second connector 39B. The current calculation unit 13 calculates these first and second distributions, then compares the two current values in each part on the plane conductor 30 to extract the current with larger absolute value, for example, to calculate a third distribution.

Figure 14:
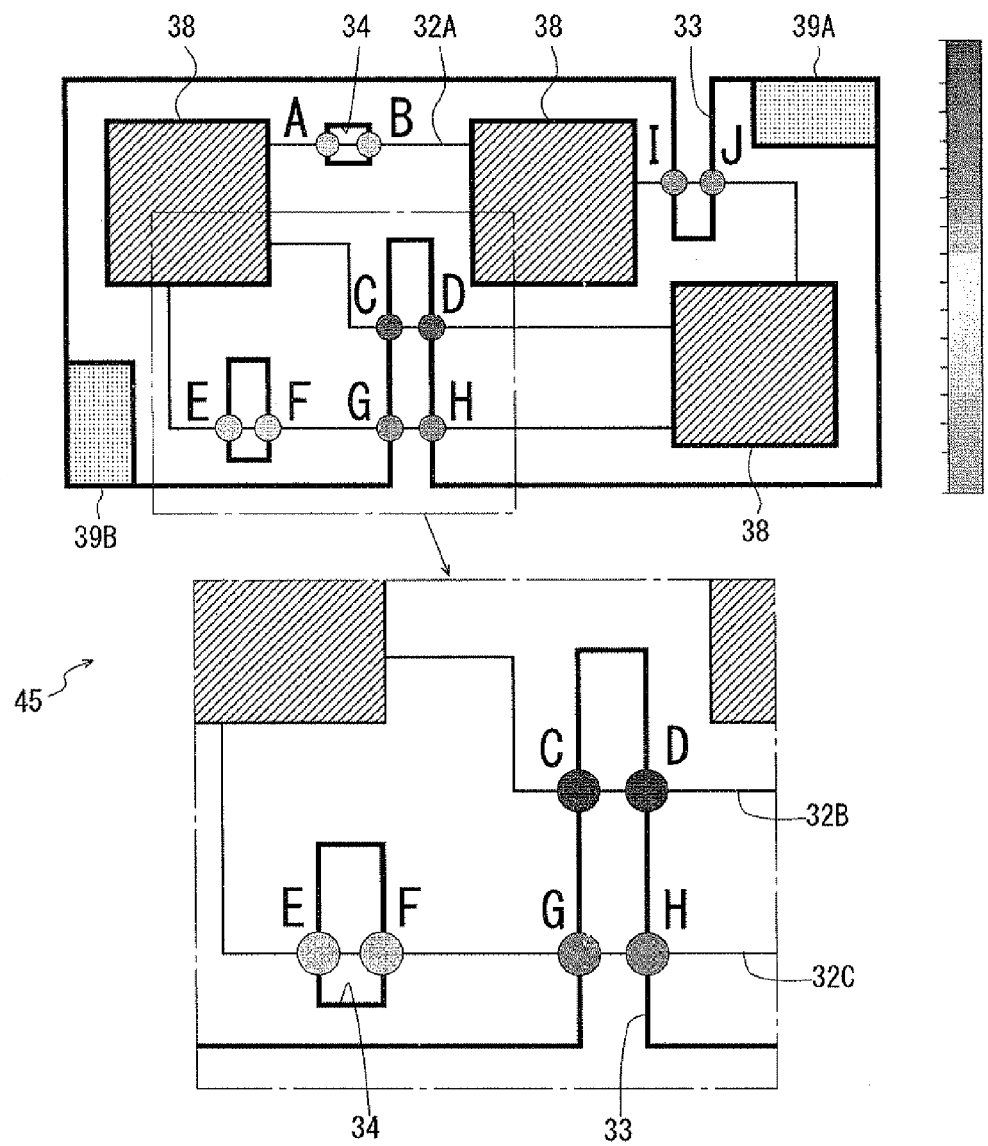
FIG. 14 illustrates error information display when weighting is required in the first exemplary embodiment.

Next, the weighting unit 14 weights the results of the design rule check according to the noise current value corresponding to each of the positions where the wires 32A to 32D cross the slits 33 or the holes 34. The error information generation unit 15 generates the error information display based on the results of weighting, and outputs the error information display to the output device 24. FIG. 14 illustrates the error information display when weighting is required. The error information display according to this example includes an error marked layout pattern 45 and an error list 46.

The error marked layout pattern 45 is designed to be able to visually recognize the risk level in each of the error positions A to J. To be more specific, the circles corresponding to the error positions A to J are colored (including color shading), and a darker region has a higher error risk level.

In the error list 46, each of the error positions A to J is classified according to the risk level. In this example, the error risk level of each of the error positions C and D is "high", the error risk level of each of the error positions G, H, I, and J is "intermediate", and the error risk level of each of the error positions A, B, E, and F is "low". The risk level depends on the distributions of noise currents shown in FIG. 13. In short, the risk level increases with increasing current value of the position corresponding to each of the error positions A to J.

As described above, by color coding the error marks according to the noise current value and by displaying the risk levels by stages, it is possible to easily specify the positions where the design should be preferentially changed.

It may also be possible to add different error points to the respective check items of the design rule check or change the multiplier of the point according to the type of the net which is to be checked. In the former case, for example, two points are added in the error in which the wire 32 crosses the slits 33 as shown in FIG. 4, and one point is added in the error in which the guard pattern 37 is interrupted as shown in FIG. 6. In this way, the weight according to the risk level of the error content can be added. In the latter case, for example, the multiplier according to the degree of importance of the wire to be protected can be set. In this case, for example, the error point is tripled in a reset wire, the error point is doubled in a clock wire and a power supply wire, and the original error point is added in other signal wires. These methods make it easy to specify an important wire where high risk errors occur. In addition to the classification of the risk levels as described above, the multiplier staged according to the magnitude of the noise current on the plane conductor may be multiplied by the error point.

In a typical multi-layered printed wiring board, the plane conductor 30 is formed across multiple layers. Hereinafter, modeling when calculating the noise current flowing through the plurality of plane conductors 30 by the electromagnetic field simulation will be supplementarily described.

Figure 15:
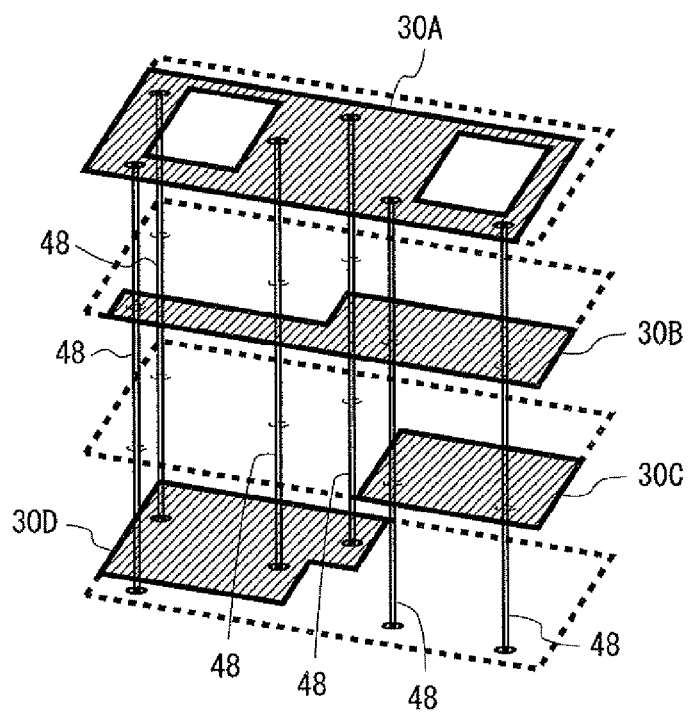
FIG. 15 is a diagram illustrating an electromagnetic field simulation model where plane conductors in the respective layers and vias connecting the plane conductors are extracted in the first exemplary embodiment.

FIGS. 15 to 18 illustrate electromagnetic field simulation models for calculating the noise currents of multiple-layered plane conductors 30A to 30D. FIG. 15 is a model in which the plane conductors 30A to 30D in the respective layers and vias 48 connecting the plane conductors 30A to 30D are extracted. Also in a case in which the plane conductors 30A to 30D are connected by connection members such as capacitors, resistors, inductors or the like, the plane conductors 30A to 30D and the connection members may be extracted to form a model in a similar way. When the number of plane conductors 30 and connection members is large, the noise current can be accurately simulated although the model becomes complicated and the calculation time becomes longer.

Figure 16:
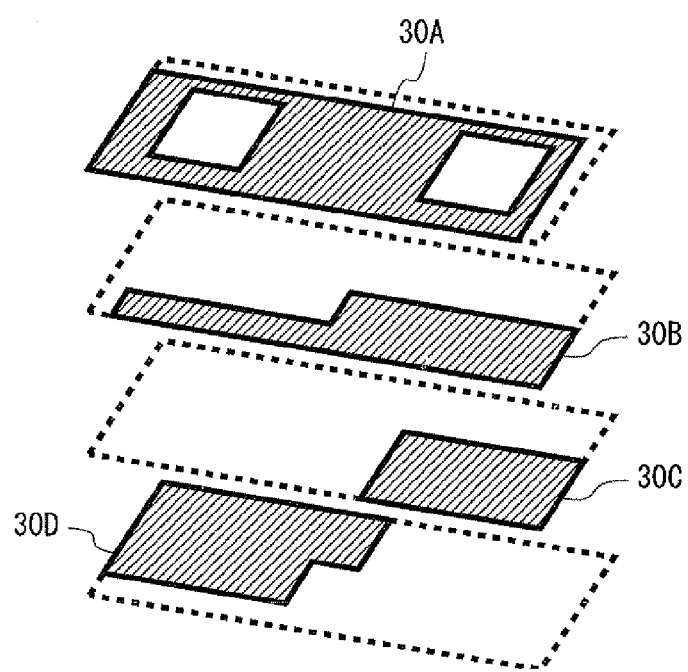
FIG. 16 is a diagram illustrating an electromagnetic field simulation model where the vias connecting the plane conductors in the respective layers are excluded and only the plane conductors in the respective layers are extracted in the first exemplary embodiment.

FIG. 16 is a model in which the capacitors, the vias 48 or the like connecting the plane conductors 30A to 30D are excluded and only the plane conductors 30A to 30D in the respective layers are extracted. Since the vias 48, the capacitors or the like are not included in the model, the noise current cannot be accurately calculated. However, since the number of components can be reduced, it is easy to form the model and is able to reduce the simulation time.

Figure 17:
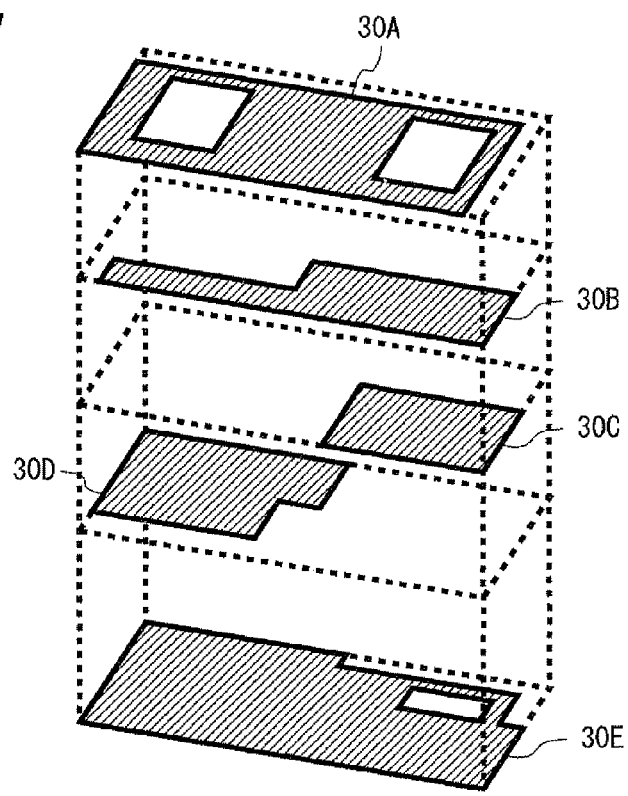
FIG. 17 is a diagram illustrating an electromagnetic field simulation model where the plane conductors in the respective layers are overlapped to form one plane conductor in the first exemplary embodiment.

FIG. 17 is a model in which the plane conductors 30A to 30D in the respective layers are overlapped to form one plane conductor 30E. In this model, the noise current among the plane conductors 30A to 30D cannot be calculated, and it is thus impossible to classify the design rule check errors occurred in the inner layer of the board into levels. However, the noise current that flows through the front and rear surfaces of the board can be calculated, thereby making it possible to perform level classification of errors generated on the surfaces of the board. Further, since one plane conductor 30E is formed, it is easy to form the model and is able to calculate the noise current in a short time.

Figure 18:
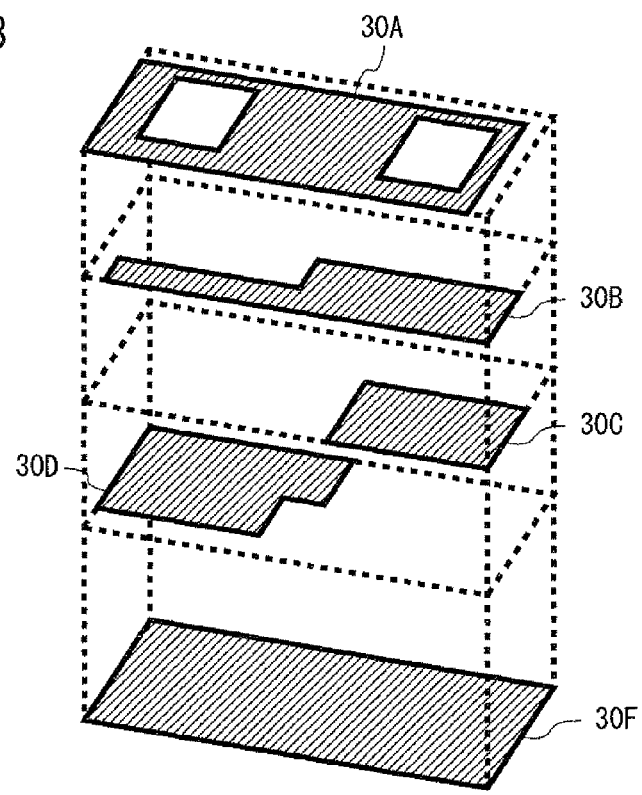
FIG. 18 is a diagram illustrating an electromagnetic field simulation model where the outer shape of the printed wiring board is one plane conductor regardless of the shapes of the plane conductors in the respective layers in the first exemplary embodiment.

FIG. 18 is a model in which the outer shape of the printed wiring board is one plane conductor 30F regardless of the shapes of the plane conductors 30A to 30D. As is similar to FIG. 17, the noise current among the plane conductors 30A to 30D cannot be calculated, and the noise current corresponding to the shape of each of the plane conductors 30A to 30D cannot be calculated as well for the board surfaces. However, in many printed wiring boards, the whole size of the plane conductors 30A to 30D is designed to be maximized so that there is no space available on the board. Therefore, when the plane conductors 30A to 30D in the respective layers are overlapped, this area is substantially equal to the outer shape of the printed wiring board. In many cases, therefore, the model shown in FIG. 17 is the same as that shown in FIG. 18. Although the modeling of FIG. 18 has the same advantages and disadvantages as in FIG. 17, the model can be formed only with the outer shape regardless of the number of plane conductors 30A to 30D and the complexity of the shape of the plane conductors, whereby it is possible to reduce the time for modeling.

As described above, a plurality of electromagnetic field simulation models to calculate the noise current may be considered. By forming the current calculation unit 13 so to be able to handle a plurality of modeling to allow the user to select a model according to the accuracy of the noise current, calculation time and the like, it is possible to efficiently carry out the design rule check.

Figure 19:
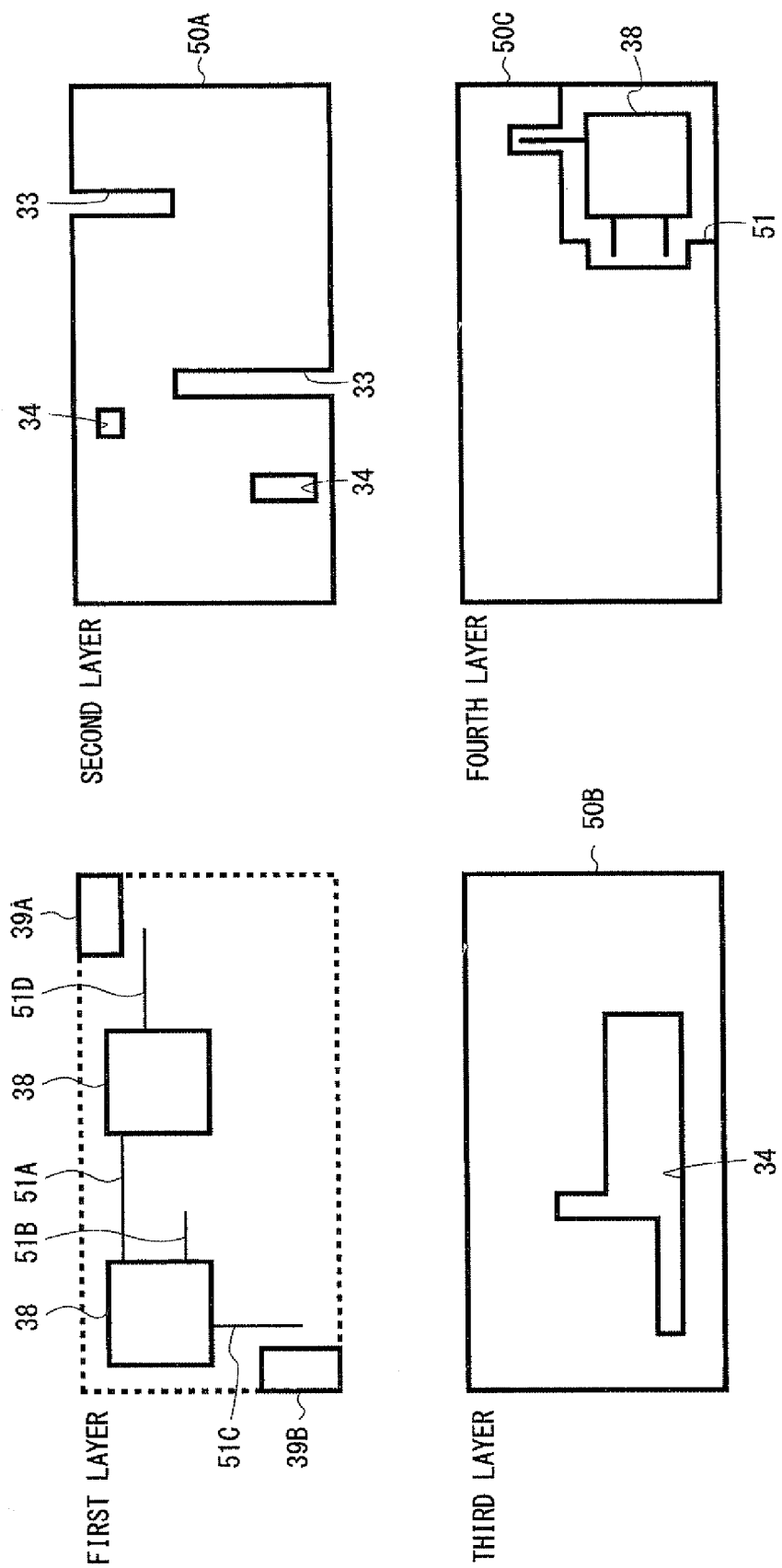
FIG. 19 illustrates a layout pattern of a printed wiring board having a four-layer structure which is a target of the design rule check in the first exemplary embodiment.

Hereinafter, the design rule check of the printed wiring board having a plurality of plane conductors will be described. FIG. 19 illustrates a printed wiring board having a four-layer structure which is the target of the design rule check. The check items of the design rule check include a case in which wires 51A to 51D cross the slits 33 or the holes 34. In this example, the description of the operation of the design rule check and the preceding operations is omitted, and an operation in which the check results are required to be weighted will be described.

Since weighting is required, the current calculation unit 13 starts electromagnetic field simulation for calculating the noise current. First, from the layout data shown in FIG. 19, the positions of plane conductors 50A to 50C in the second layer, the third layer, and the fourth layer, and the first and second connectors 39A and 39B in the first layer are extracted.

Figure 20:
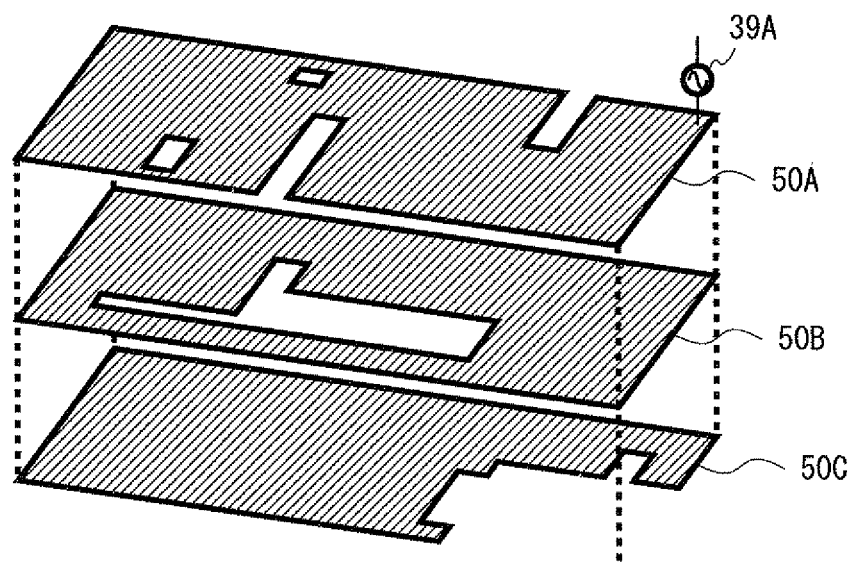
FIG. 20 is a diagram showing an electromagnetic field simulation model where positions of a first connector and the plane conductors in the respective layers are extracted from the layout pattern in the example shown in FIG. 19.
Figure 21:
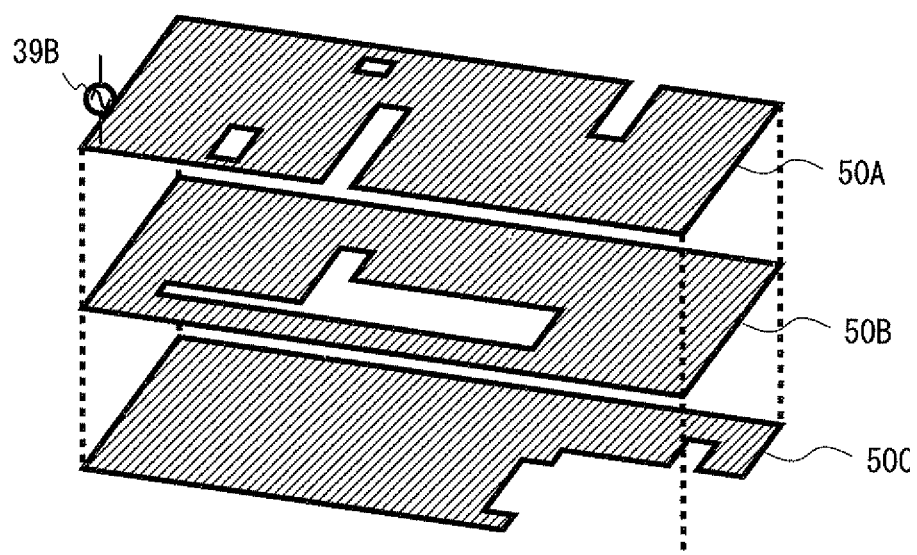
FIG. 21 is a diagram showing an electromagnetic field simulation model where positions of a second connector and the plane conductors in the respective layers are extracted from the layout pattern in the example shown in FIG. 19.

FIGS. 20 and 21 illustrate the electromagnetic field simulation model in the example shown in FIG. 19. In this example, a model without the dielectric substrate is used, and as is similar to FIG. 16, capacitors, vias or the like connecting the plane conductors 50A to 50C are excluded. The central position of the two connectors 39A and 39B extracted from the layout pattern shown in FIG. 19 is set as the noise application point.

Figure 22:
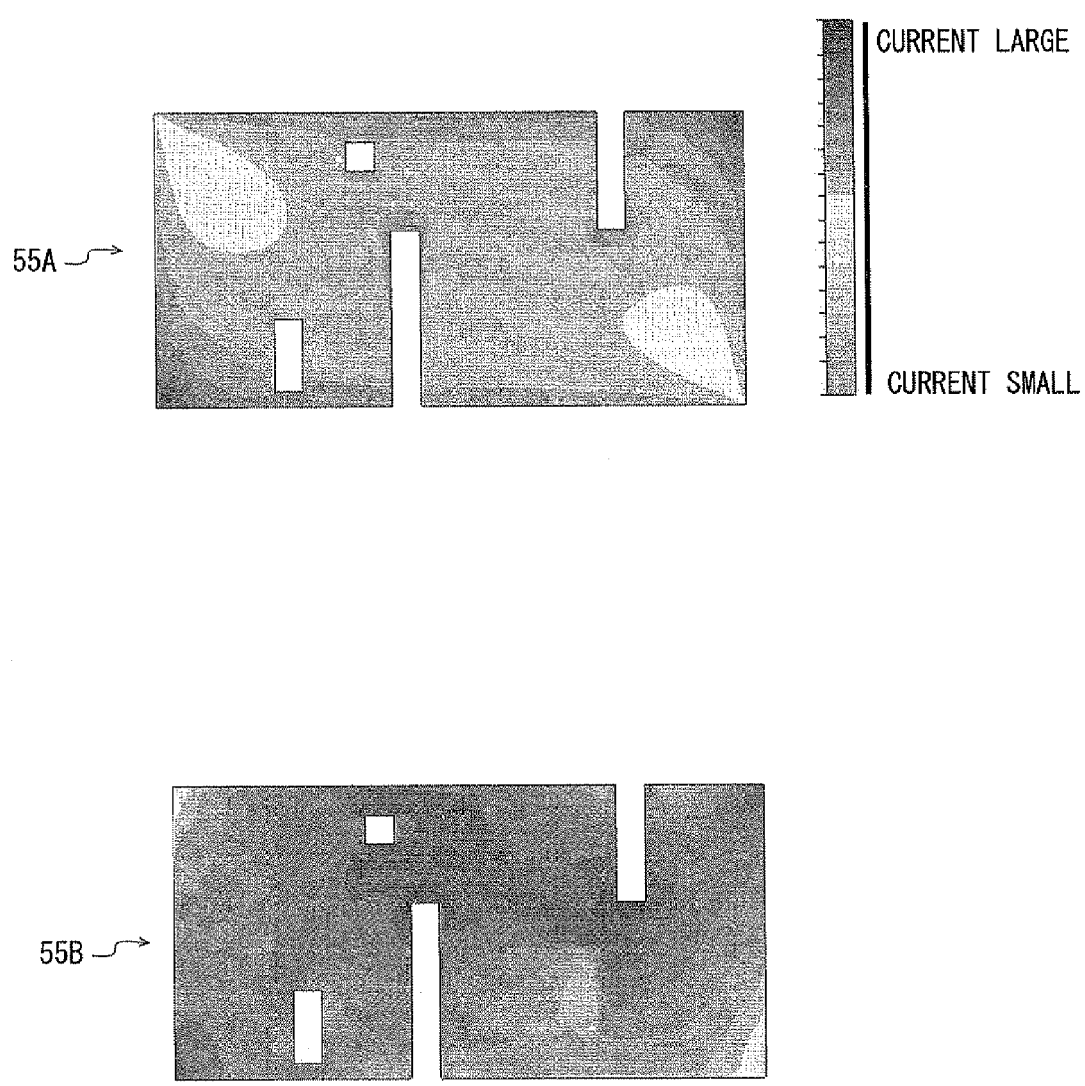
FIG. 22 is a diagram illustrating current distribution of a front surface and current distribution of a rear surface of a plane conductor in a second layer in the example shown in FIG. 19.
Figure 24:
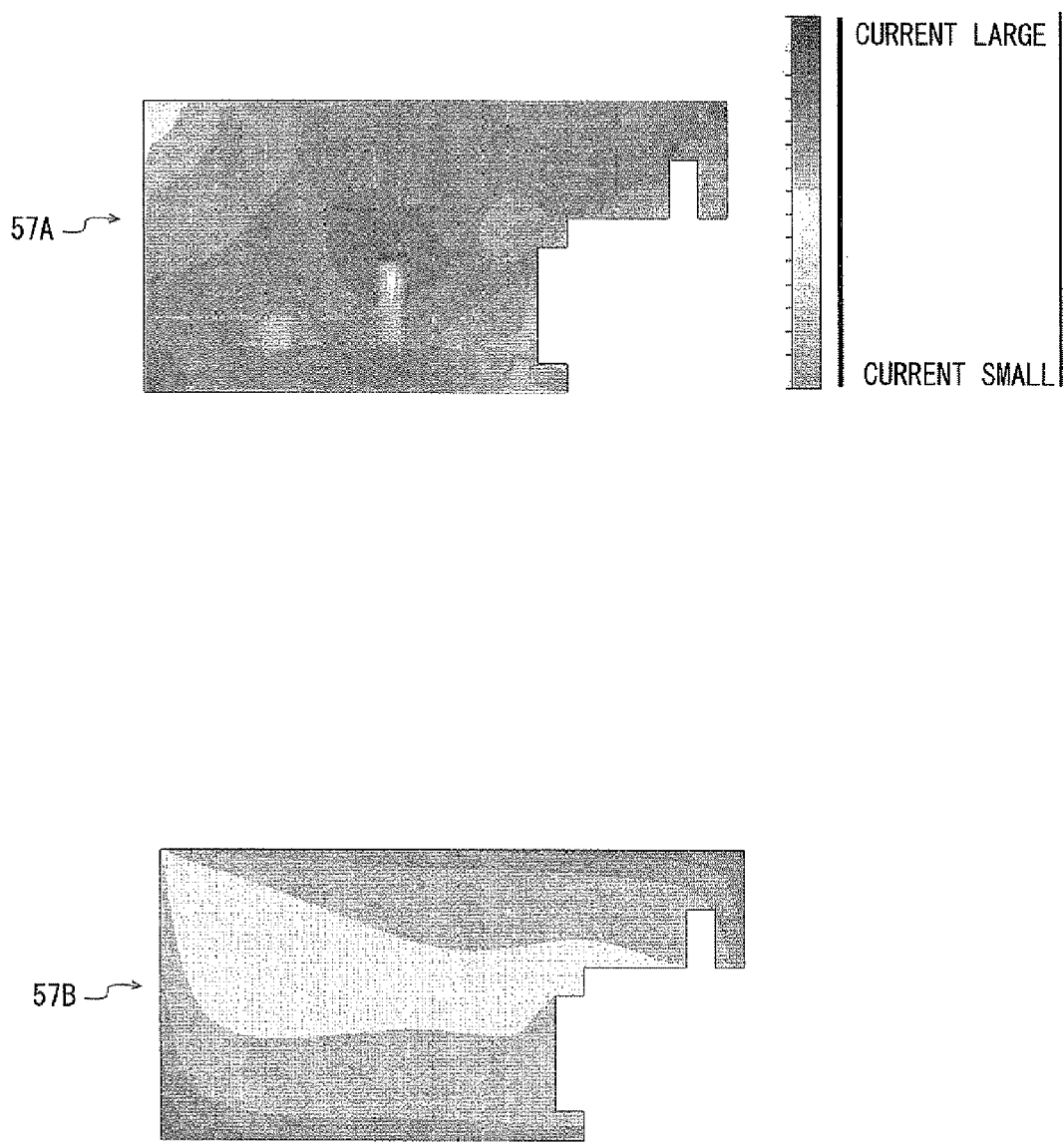
FIG. 24 is a diagram illustrating current distribution of a front surface and current distribution of a rear surface of a plane conductor in a fourth layer in the example shown in FIG. 19.

In the aforementioned model, the current values calculated for each of the both noise application points are compared for each of the plane conductors 50A to 50C to extract the current with larger absolute value. FIG. 22 illustrates a current distribution 55A of the front surface (surface on the first layer side) and a current distribution 55B of the rear surface of the plane conductor 50A in the second layer. FIG. 23 illustrates a current distribution 56A of the front surface and a current distribution 56B of the rear surface of the plane conductor 50B in the third layer. FIG. 24 illustrates a current distribution 57A of the front surface and a current distribution 57B of the rear surface of the plane conductor 50C in the fourth layer.

FIG. 25 illustrates error information display in the examples shown in FIGS. 19 to 24. The error information display according to this example includes an error marked layout pattern 58 and an error list 59.

The error marked layout pattern 58 is designed to be able to visually recognize the risk level in each of the error positions A to L. To be more specific, the circles corresponding to the error positions A to L are colored (including color shading), and a darker region has a higher error risk level.

In the error list 59, each of the error positions A to L is classified according to the risk level. In this example, the error risk level of each of the error positions C and D is "high", the error risk level of each of the error positions E, F, I, J, M, and N is "intermediate", and the error risk level of each of the error positions A, B, G, H, K, and L is "low". The risk level depends on the distributions of noise currents shown in FIGS. 22 to 24. In short, the risk level increases with increasing current value of the position corresponding to each of the error positions A to L.

As described above, according to this exemplary embodiment, the results of the error detection by the design rule check are weighted according to the noise current values flowing through the printed wiring board (plane conductor), the risk level of each error is assumed according to this weighting, and the error information including the risk level is provided to the user. In this way, the user is able to easily find the positions with high error risk level, i.e., the positions where design should be preferentially changed.

Second Exemplary Embodiment

Figure 26:
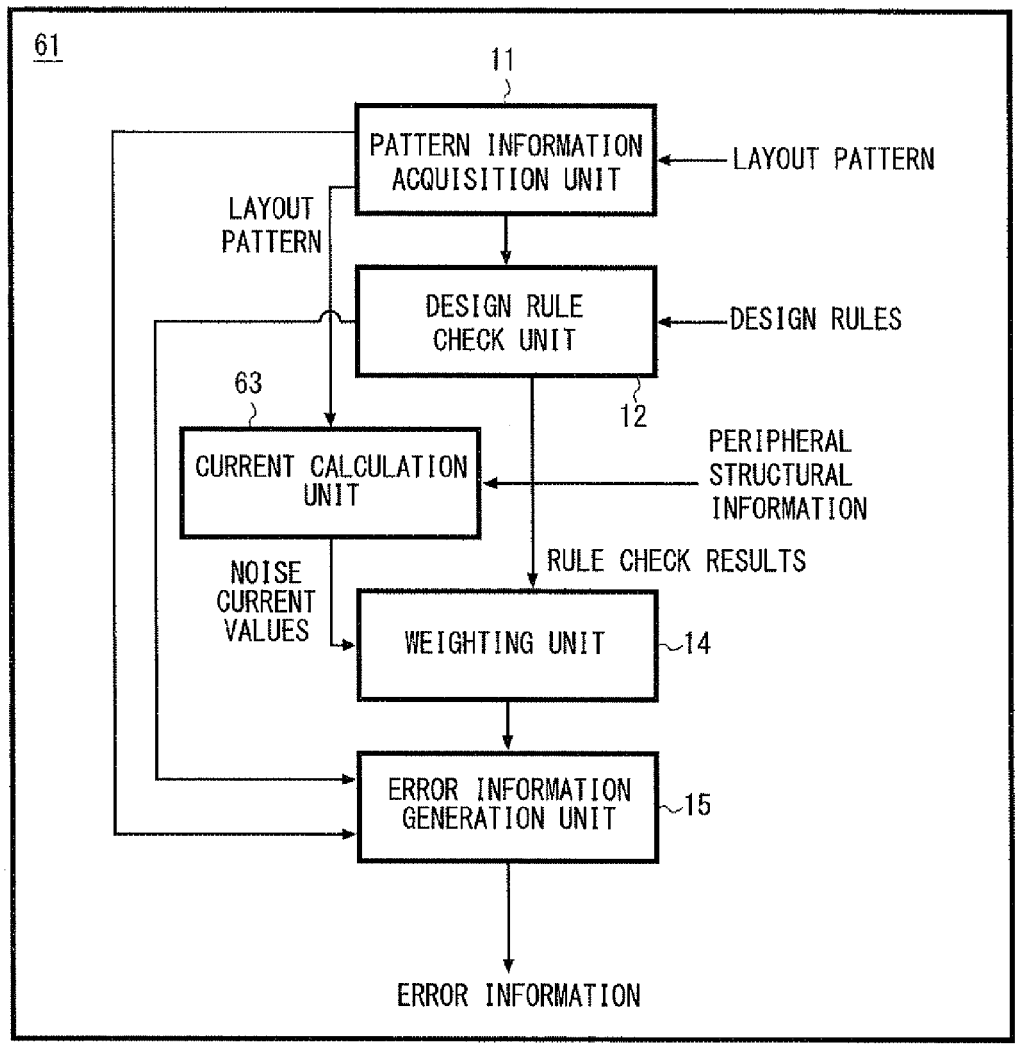
FIG. 26 is a diagram showing a functional configuration of a design rule check system according to a second exemplary embodiment of the present invention.

FIG. 26 shows a functional configuration of a design rule check system 61 according to a second exemplary embodiment of the present invention. The difference between the design rule check system 61 and the design rule check system 1 according to the first exemplary embodiment mainly lies in the operation of a current calculation unit 63.

The current calculation unit 63 according to this exemplary embodiment takes into account the peripheral structures such as an antenna, a cable, a case, a battery connected to a printed wiring board, a metal case which shields an LSI through which electromagnetic noise enters to calculate the noise current. In short, the current calculation unit 63 also refers to the peripheral structural information regarding the peripheral structure in addition to the layout pattern (design information stored in the storage device 22 shown in FIG. 2) to calculate the noise current.

Figure 27:
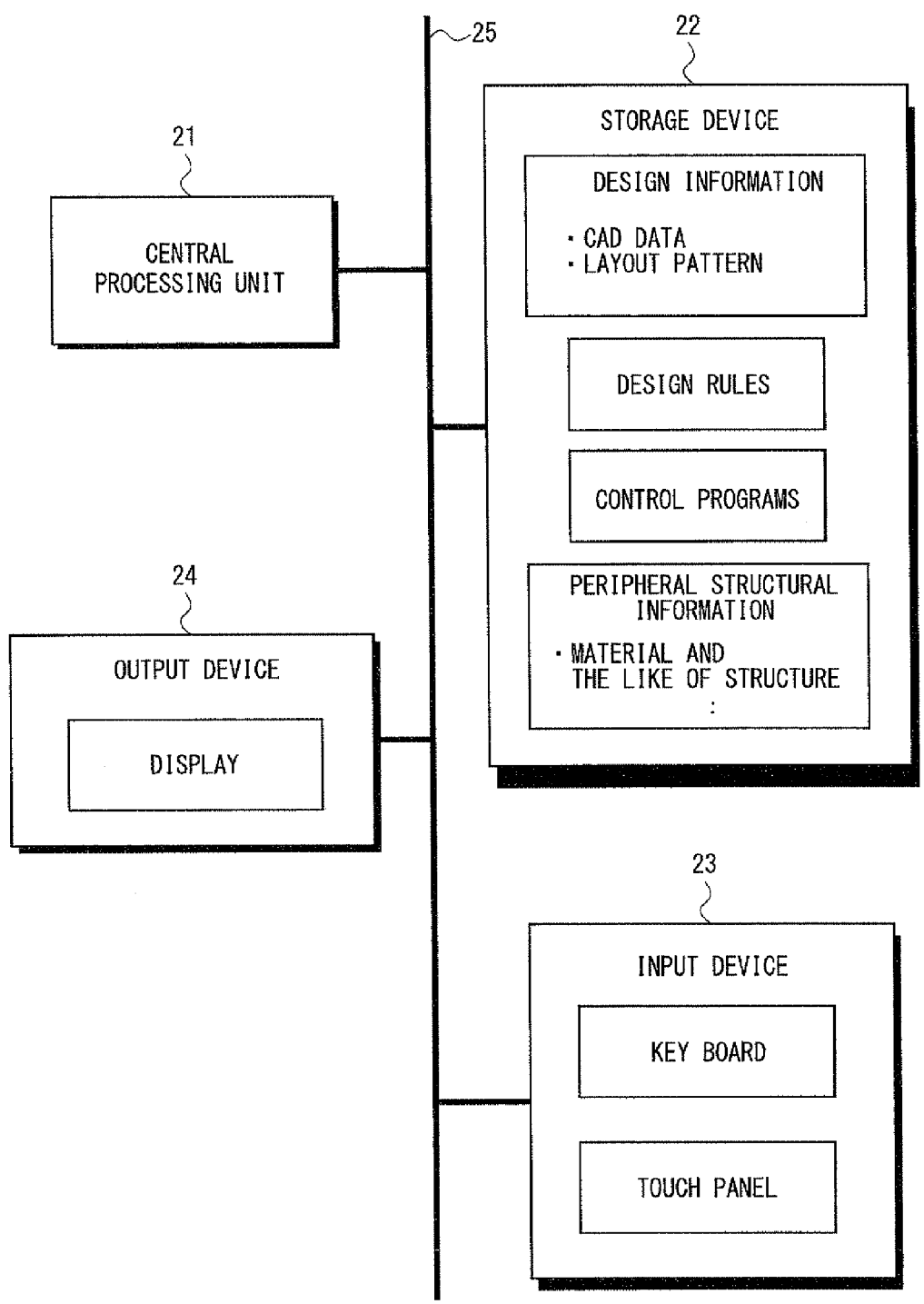
FIG. 27 is a diagram illustrating a hardware configuration of the design rule check system according to the second exemplary embodiment.

FIG. 27 illustrates a hardware configuration of the design rule check system 61 according to the second exemplary embodiment. While the hardware configuration according to this example is basically similar to the hardware configuration shown in FIG. 2 according to the first exemplary embodiment, a storage device 22 according to this example is different from the storage device according to the first exemplary embodiment in that the storage device 22 stores the peripheral structural information. The peripheral structural information may be acquired, for example, by the user inputting information regarding the peripheral structures (e.g., the materials, the dimensions, the shapes, the positions, and the connection relations of the peripheral structures) using the input device 23. The current calculation unit 63 according to this exemplary embodiment calculates the noise current values not only based on the layout pattern information but also based on the peripheral structural information, as shown in FIG. 26.

Figure 28:
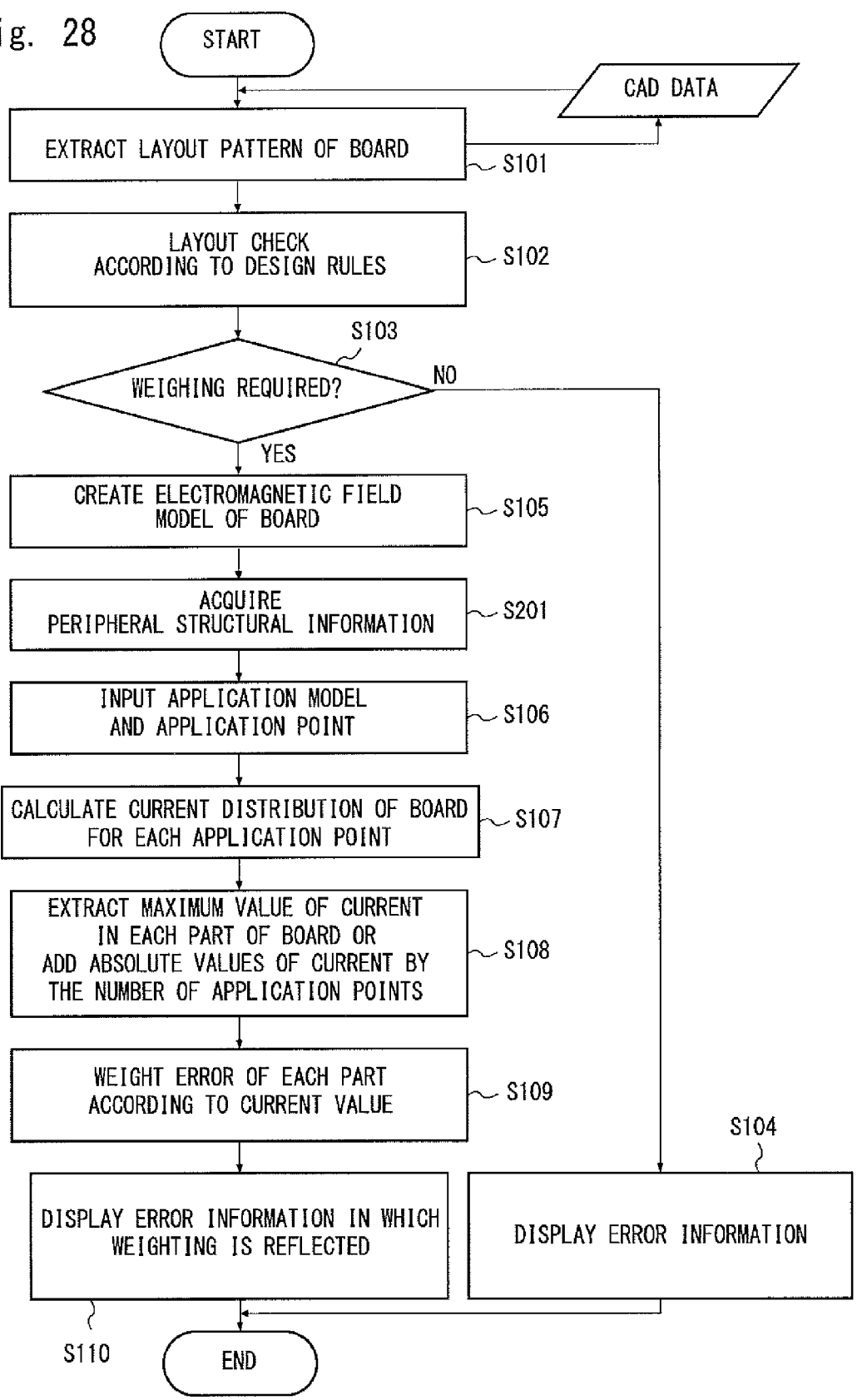
FIG. 28 is a flowchart illustrating an operation of the design rule check system according to the second exemplary embodiment.

FIG. 28 shows an operation of the design rule check system 61 according to the second exemplary embodiment. The flowchart shown in FIG. 28 is different from the flowchart shown in FIG. 3 according to the first exemplary embodiment in that Step S201 regarding the input of the peripheral structural information is added between Steps S105 and S106. The flowchart shown in FIG. 28 will be described below.

When the system starts the operation, the pattern information acquisition unit 11 reads CAD data of the printed wiring board to acquire a layout pattern including information of the wiring layers, positional coordinates of wires, a power supply, a ground, active elements, and passive elements (S101).

The design rule check unit 12 next reads the design rules to carry out the design rule check on the layout pattern that is acquired to determine whether the layout pattern satisfies the constraints defined by the design rule check items (S102).

Next, it is determined whether the results of the design rule check need to be weighted in consideration of the electromagnetic noise from the outside, or in other words, whether the level classification of the error positions is required (S103). This determination may have a configuration in which the number of errors of the check results is presented to the user and the user inputs information indicating whether to perform weighting or not, or a configuration in which weighting processing is automatically carried out if the number of errors is equal to or larger than a predetermined number.

When there is no need to perform weighting in Step S103 (NO), the error information generation unit 15 causes the output device 24 to output error information display including an error marked layout pattern and an error list (S104). In the error marked layout pattern, error positions on the layout pattern are marked, and the error list indicates a corresponding relation of identification names and error items of the wires.

Meanwhile, when it is determined in Step S103 that weighting is required (YES), the current calculation unit 63 creates an electromagnetic field model of the board (plane conductor) based on the layout pattern (S105), acquires the peripheral structure information (S201), inputs an application model and an application point described later to the electromagnetic field model (S106), to calculate the current distribution of the board for each application point (S107). After that, the current calculation unit 63 extracts the maximum value of the current in each part in each application point, or adds the current values in each part in each application point (S108), to calculate the noise current value in each part on the board required for the weighting.

The weighting unit 14 weights the results of the error detection by the design rule check according to the magnitude of the noise current values calculated in Step S108 and corresponding to the error position (S109).

The error information generation unit 15 then causes the output device 24 to output error information display including the error list and the error marked layout pattern in which the weighting is reflected (S110).

The current calculation unit 63 takes into consideration the peripheral structure information in addition to the layout pattern information acquired from the pattern information acquisition unit 11 when creating the electromagnetic field simulation model. For example, the noise application point may be arranged in a position such as an antenna, a cable, a connector, a switch through which electromagnetic noise enters, to calculate the noise current. The noise application point may be arranged in other positions than the antenna or the like, and may be arranged in a position such as a case or a battery which is arbitrarily specified by the user according to the configuration of the electronic device.

Figure 29:
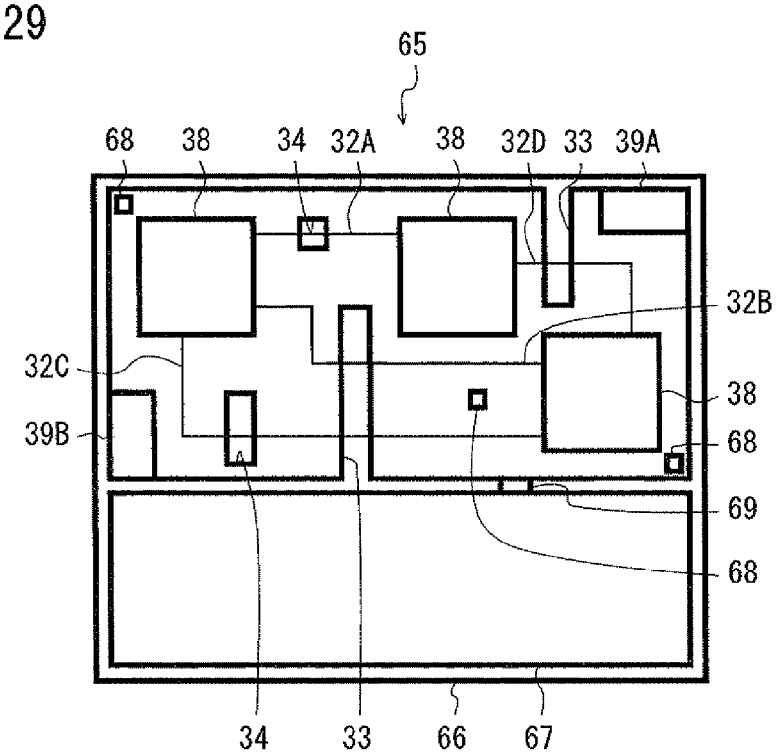
FIG. 29 is a diagram illustrating a printed wiring board which is a target of a design rule check according to the second exemplary embodiment.
Figure 30:
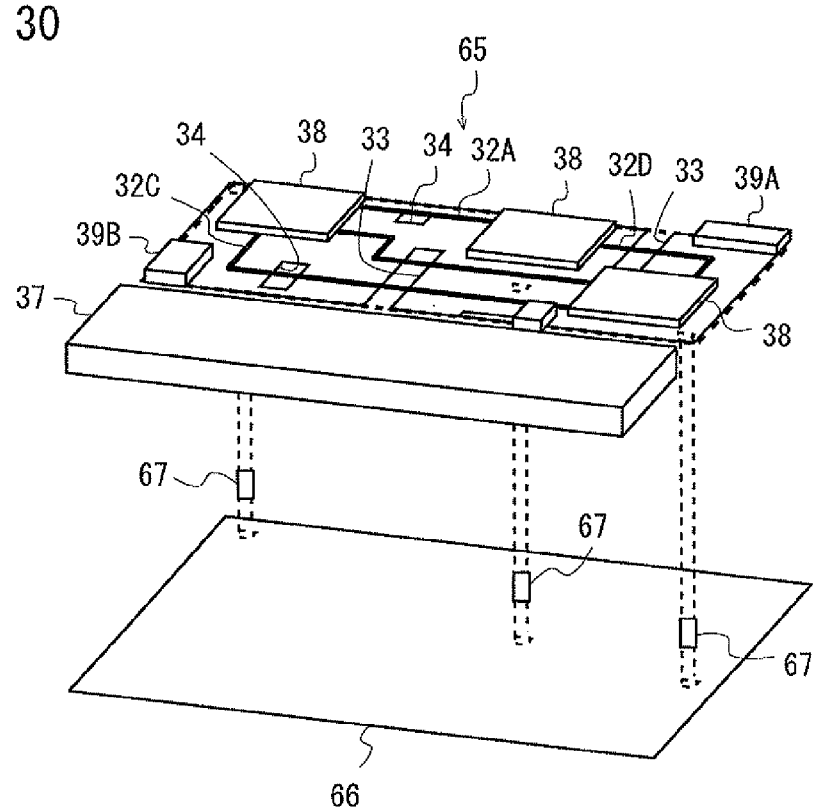
FIG. 30 is a diagram illustrating a printed wiring board which is a target of the design rule check according to the second exemplary embodiment.

FIG. 29 and FIG. 30 illustrate a printed wiring board 65 which is a target of the design rule check by the design rule check system 61 according to the second exemplary embodiment. The printed wiring board 65 has a two-layer structure in which a case 66 and batteries 67 are connected.

The printed wiring board 65 according to this example includes three conductive case connection parts 68 connected to the case 66 and a battery connection part 69 connected to the batteries 67. The case 66 and the plane conductor 30 having the similar shape as those in the first exemplary embodiment are connected by the respective case connection parts 68. The ground terminals of the batteries 67 and the plane conductor 30 are connected by the battery connection part 69.

The peripheral structural information stored in the storage device 22 shown in FIG. 27 stated above includes design information regarding the material, the shape, the dimension, the position and the like of each of the case 66, the batteries 67, the case connection part 68, and the battery connection part 69. Further, the design information stored in the storage device 22 includes design information regarding the printed wiring board except for the peripheral structural information. Furthermore, the design rule check includes check items to detect the positions where the wires 32A to 32D cross the slits 33 and the holes 34 of the plane conductor 30. In this example, the description of the operation of the design rule check and the preceding operations are omitted, and an operation is described when the check results are required to be weighted.

Figure 31:
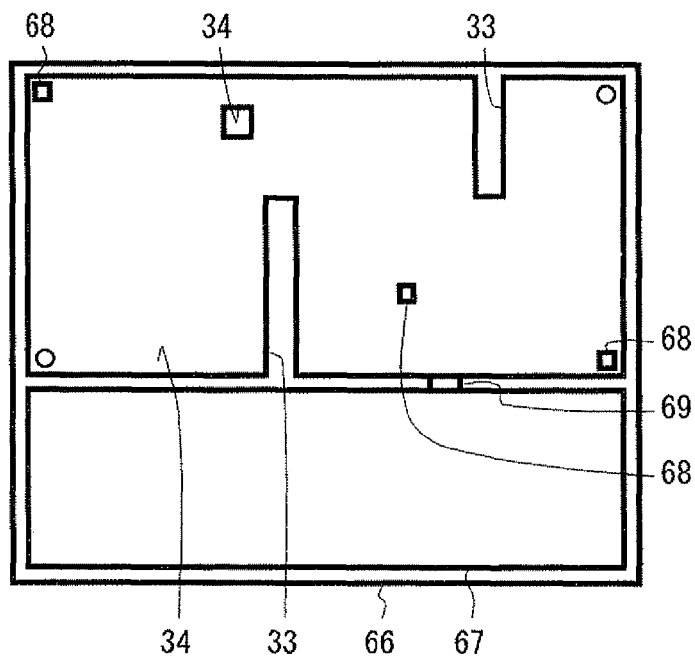
FIG. 31 is a diagram showing an electromagnetic field simulation model according to the second exemplary embodiment.
Figure 32:
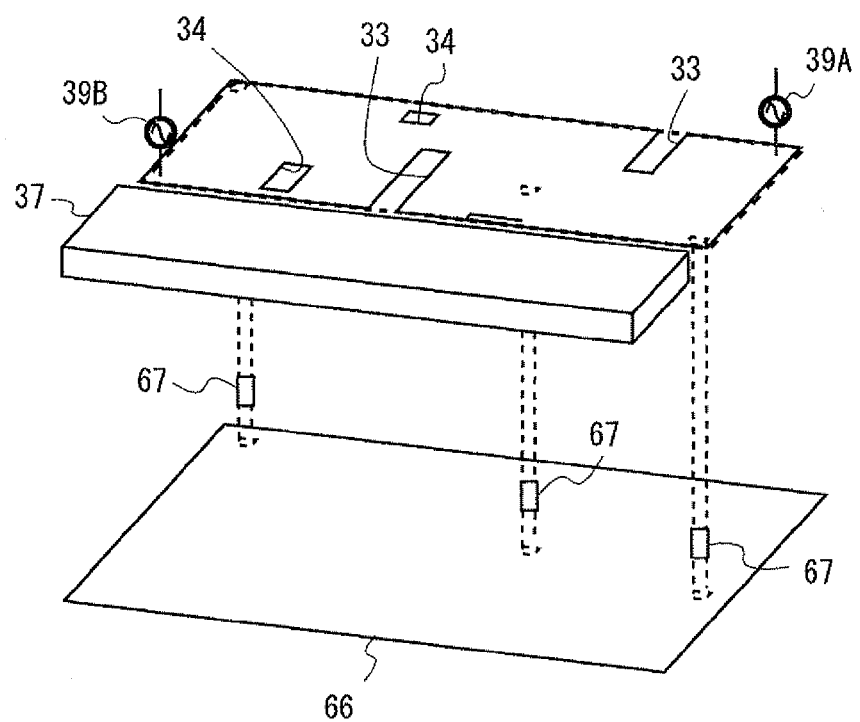
FIG. 32 is a diagram showing an electromagnetic field simulation model according to the second exemplary embodiment.

Since the weighting is required, the current calculation unit 63 starts the electromagnetic field simulation to calculate the noise current. FIG. 31 and FIG. 32 show electromagnetic field simulation models according to the second exemplary embodiment. First, the plane conductor 30 in the second layer and the connectors 39A and 39B in the first layer are extracted from the layout data shown in FIG. 29, and a model of only the plane conductor 30 is formed. In this example, a model without the dielectric substrate is used.

Next, the peripheral structural information regarding the material and the like of each of the case 66, the batteries 67, the case connection part 68, and the battery connection part 69 is input by the user. The peripheral structural information is added to the model created by the current calculation unit 68.

Figure 33:
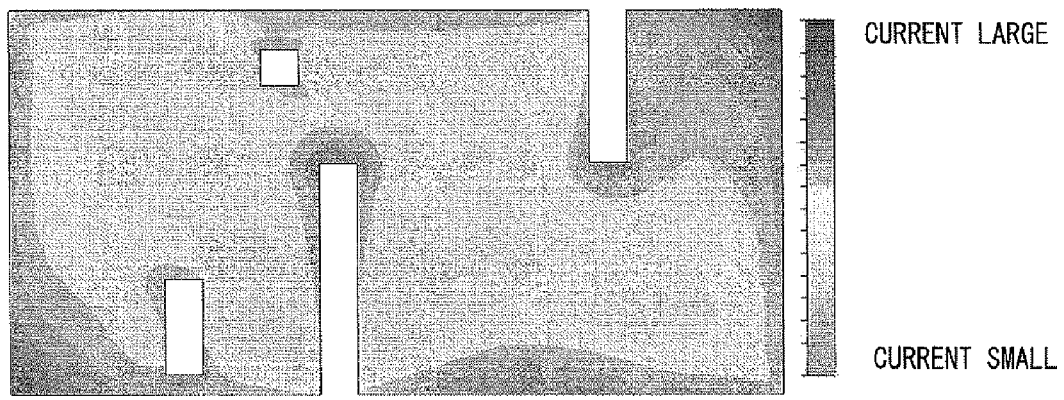
FIG. 33 is a diagram showing current distribution of a plane conductor in the examples of FIG. 29 and FIG. 30.

Next, the extracted central position of the connectors 39A and 39B is arranged on the model as a noise application point. The current calculation unit 63 compares the current values calculated for each of the both noise application points in each part of the plane conductor 30, and extracts the current with larger absolute value in each part or adds the current values in each part. FIG. 33 shows distribution of noise currents on the plane conductor 30 thus calculated in the second exemplary embodiment.

The weighting unit 14 then weights the results of the design rule check in the error positions where the wires 32A to 32D cross the slits 33 or the holes 34 according to the noise current values in positions of the plane conductor 30 corresponding to these positions.

Figure 34:
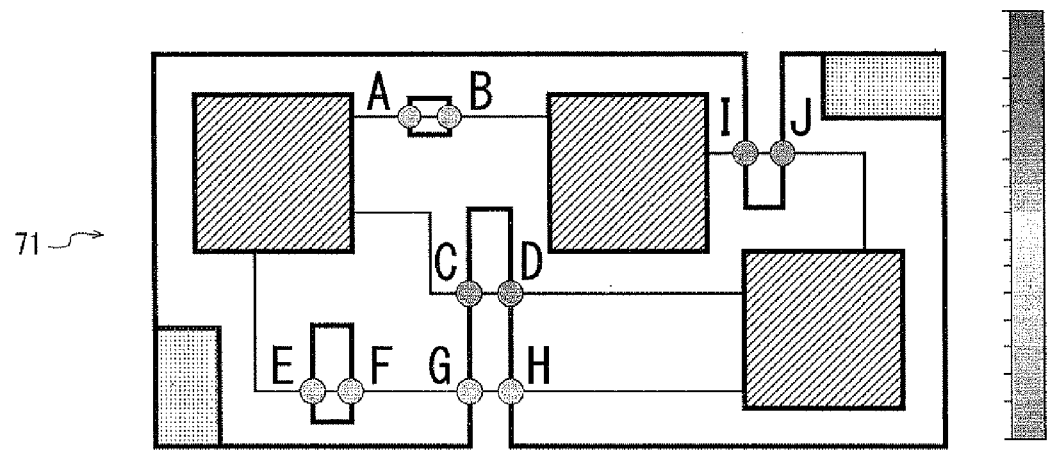
FIG. 34 is a diagram illustrating error information display when weighting is required in the second exemplary embodiment.

The error information generation unit 15 generates the error information display based on the results of weighting to output the error information display to the output device 24. FIG. 34 illustrates error information display according to the second exemplary embodiment. The error information display according to this example includes an error marked layout pattern 71 and an error list 72. The circles corresponding to the error positions A to J of the error marked layout pattern 71 are colored (including color shading), and a darker region has a higher error risk level. Further, in the error list 72, each of the error positions A to J is classified according to the risk level. The risk level increases with increasing noise current value corresponding to each of the error positions A to J.

As described in the second exemplary embodiment, since the peripheral structural information is also taken into consideration, it is possible to calculate the distribution of noise currents more accurately compared to the first exemplary embodiment and to determine the risk level of each error position more accurately.

Note that the present invention is not limited to the exemplary embodiments stated above, and may be changed as appropriate without departing from the spirit of the present invention.

Although the present invention is described as a hardware configuration in the above exemplary embodiments, the present invention is not limited thereto. The present invention may be implemented by causing a CPU (Central Processing Unit) to execute a computer program to perform processing of the mobility management device, the switching device or the SGSN. The above-described program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2012-67381, filed on Mar. 23, 2012, the disclosure of which is incorporated herein in its entirety by reference.

REFERENCE SIGNS LIST 1, 61 DESIGN RULE CHECK SYSTEMS
11 PATTERN INFORMATION ACQUISITION UNIT
12 DESIGN RULE CHECK UNIT
13, 63 CURRENT CALCULATION UNITS
14 WEIGHTING UNIT
15 ERROR INFORMATION GENERATION UNIT
21 CENTRAL PROCESSING UNIT
22 STORAGE DEVICE
23 INPUT DEVICE
24 OUTPUT DEVICE
30, 30A-30C, 50A-50C PLANE CONDUCTORS
31A-31D, A-J ERROR POSITIONS
32, 32A-32D WIRES
33 SLIT
34 HOLE
37 GUARD PATTERN
38 LSI
39A, 39B CONNECTORS
45, 58, 71 ERROR MARKED LAYOUT PATTERNS
46, 59, 72 ERROR LISTS
48 VIA
66 CASE
67 BATTERY
68 CASE CONNECTION PART
69 BATTERY CONNECTION PART

The invention claimed is:

1. A design rule check system comprising:
pattern information acquisition unit that acquires a layout pattern of a board to be checked;
design rule check unit that carries out a design rule check on the layout pattern;
current calculation unit that calculates, based on the layout pattern, distribution of noise current values on the board;
weighting unit that adds a weight to a result of the design rule check according to the magnitude of the noise current values calculated by the current calculation processing conducted by the current calculation unit and corresponding to each error position detected through the design rule check; and
error information generation unit that generates information indicating a risk level of each error position based on the weight.

2. The design rule check system according to claim 1, wherein the current calculation unit calculates the noise current values not only based on the layout pattern but also based on peripheral structural information regarding a structure at a periphery of the board.

3. The design rule check system according to claim 1, wherein the current calculation unit performs electromagnetic field simulation using a model in which a noise application point on a plane conductor of the board is assumed.

4. The design rule check system according to claim 1, wherein the current calculation unit calculates the distribution of the noise current values when the design rule check unit detects a predetermined number of error positions or more.

5. The design rule check system according to claim 1, wherein the current calculation unit calculates the distribution of the noise current values upon receiving a request from a user.

6. A design rule check method comprising:
  a pattern information acquisition step for acquiring a layout pattern of a board to be checked;
  a design rule check step for carrying out a design rule check on the layout pattern;
  a current calculation step for calculating, based on the layout pattern, distribution of noise current values on the board;
  a weighting step for adding a weight to a result of the design rule check according to the magnitude of the noise current values calculated by the current calculation step and corresponding to each error position detected through the design rule check; and
  an error information generation step for generating information indicating a risk level of each error position based on the weight.

7. A non-transitory computer readable medium storing a design rule check program for causing a computer to execute the following processing of:
  pattern information acquisition processing for acquiring a layout pattern of a board to be checked;
  design rule check processing for carrying out a design rule check on the layout pattern;
  current calculation processing for calculating, based on the layout pattern, distribution of noise current values on the board;
  weighting processing for adding a weight to a result of the design rule check according to the magnitude of the noise current values calculated by the current calculation processing and corresponding to each error position detected through the design rule check; and
  error information generation processing for generating information indicating a risk level of each error position based on the weight.

* * * * *